US012217931B2

(12) United States Patent
Rosa-Molinar et al.

(10) Patent No.: US 12,217,931 B2
(45) Date of Patent: Feb. 4, 2025

(54) GRAPHENE BASED SUBSTRATES FOR IMAGING

(71) Applicants: THE UNIVERSITY OF KANSAS, Lawrence, KS (US); Kansas State University Research Foundation, Manhattan, KS (US)

(72) Inventors: Eduardo Rosa-Molinar, Lawrence, KS (US); Noraida Martinez-Rivera, Lawrence, KS (US); Prem Singh Thapa-Chetri, Lawrence, KS (US); WenJun Xiang, Manhattan, KS (US); Suprem Ranjan Das, Manhattan, KS (US)

(73) Assignees: University of Kansas, Lawrence, KS (US); Kansas State University Research Foundation, Manhattan, KS (US)

( * ) Notice: Subject to any disclaimer, the term of this patent is extended or adjusted under 35 U.S.C. 154(b) by 785 days.

(21) Appl. No.: 17/413,114

(22) PCT Filed: Dec. 11, 2019

(86) PCT No.: PCT/US2019/065633
§ 371 (c)(1),
(2) Date: Jun. 11, 2021

(87) PCT Pub. No.: WO2020/123597
PCT Pub. Date: Jun. 18, 2020

(65) Prior Publication Data
US 2022/0068596 A1 Mar. 3, 2022

Related U.S. Application Data

(60) Provisional application No. 62/778,140, filed on Dec. 11, 2018.

(51) Int. Cl.
*H01J 37/00* (2006.01)
*B05D 1/30* (2006.01)
*B05D 3/02* (2006.01)
*B05D 7/00* (2006.01)
*C09D 1/00* (2006.01)
*C09D 7/65* (2018.01)
*G01N 1/06* (2006.01)
(Continued)

(52) U.S. Cl.
CPC .............. *H01J 37/261* (2013.01); *B05D 1/30* (2013.01); *B05D 3/0254* (2013.01); *B05D 7/56* (2013.01);
(Continued)

(58) Field of Classification Search
CPC ........ H01J 37/261; H01J 37/28; H01J 37/285; H01J 2237/2801; H01J 2237/2802;
(Continued)

(56) References Cited

U.S. PATENT DOCUMENTS 5,510,395 A    4/1996  Tomioka et al.
8,455,842 B2*  6/2013  Zhang ..................... H01J 37/20
                                                              250/311
(Continued)

OTHER PUBLICATIONS

International Search Report and Written Opinion issued by the International Searching Authority (ISA/US) in PCT Application No. PCT/US2019/065633 on Feb. 21, 2020. 10 pages.
(Continued)

*Primary Examiner* — Michael Maskell
(74) *Attorney, Agent, or Firm* — Meunier Carlin & Curfman LLC

(57) ABSTRACT

Disclosed are articles comprising substrate and graphene coating that are configured to support a sample for electron or optical microscopy. Also disclosed are methods of making the same and methods of using the same in imaging technology.

26 Claims, 13 Drawing Sheets

(51) Int. Cl.
*H01J 37/26* (2006.01)
*H01J 37/28* (2006.01)
*H01J 37/285* (2006.01)

(52) U.S. Cl.
CPC ............... *C09D 1/00* (2013.01); *C09D 7/65* (2018.01); *G01N 1/06* (2013.01); *H01J 37/28* (2013.01); *H01J 37/285* (2013.01); *B05D 2201/02* (2013.01); *B05D 2202/40* (2013.01); *B05D 2203/35* (2013.01); *H01J 2237/2801* (2013.01); *H01J 2237/2802* (2013.01); *H01J 2237/2813* (2013.01)

(58) Field of Classification Search
CPC .... H01J 2237/2813; H01J 37/20; B05D 1/30; B05D 3/0254; B05D 7/56; B05D 2201/02; B05D 2202/40; B05D 2203/35; B05D 2601/20; C09D 1/00; C09D 7/65; G01N 1/06; G02B 21/34
USPC ................. 250/306, 307, 310, 311, 440.11
See application file for complete search history.

(56) References Cited

U.S. PATENT DOCUMENTS

| | | | | |
|---|---|---|---|---|
| 9,269,534 | B2 * | 2/2016 | Ogura | G01N 23/225 |
| 9,412,556 | B2 | 8/2016 | Khalid et al. | |
| 9,530,531 | B2 * | 12/2016 | Lin | B05D 1/04 |
| 2010/0093022 | A1 * | 4/2010 | Hayworth | G01N 1/06 |
| | | | | 83/72 |
| 2011/0226413 | A1 * | 9/2011 | Zhang | H01J 37/26 |
| | | | | 427/595 |
| 2013/0292568 | A1 * | 11/2013 | Bizen | H01J 37/244 |
| | | | | 250/311 |
| 2014/0014171 | A1 | 1/2014 | Alam et al. | |
| 2015/0118126 | A1 * | 4/2015 | Khalid | H01J 37/26 |
| | | | | 422/503 |
| 2016/0042912 | A1 * | 2/2016 | Adiga | G02B 1/12 |
| | | | | 250/440.11 |
| 2016/0189919 | A1 * | 6/2016 | Passmore | H01J 37/20 |
| | | | | 29/897 |
| 2017/0348687 | A1 * | 12/2017 | Liddle | H01L 21/3065 |

OTHER PUBLICATIONS

International Preliminary Report on Patentability issued for Application No. PCT/US2019/065633, dated Jun. 4, 2021.

Yoshiyuki Kubota, et al., A carbon nanotube tape for serial-section electron microscopy of brain ultrastructure, Nature Communications (2018) 9:437.

Pantelic, Radosav S., et al. "The application of graphene as a sample support in transmission electron microscopy." Solid State Communications 152.15 (2012): 1375-1382.

* cited by examiner

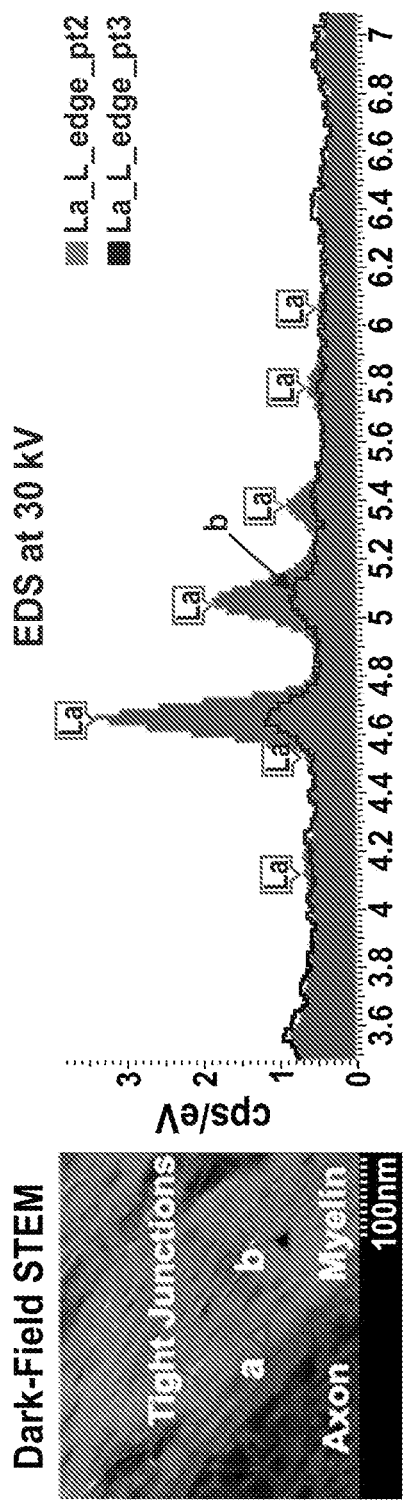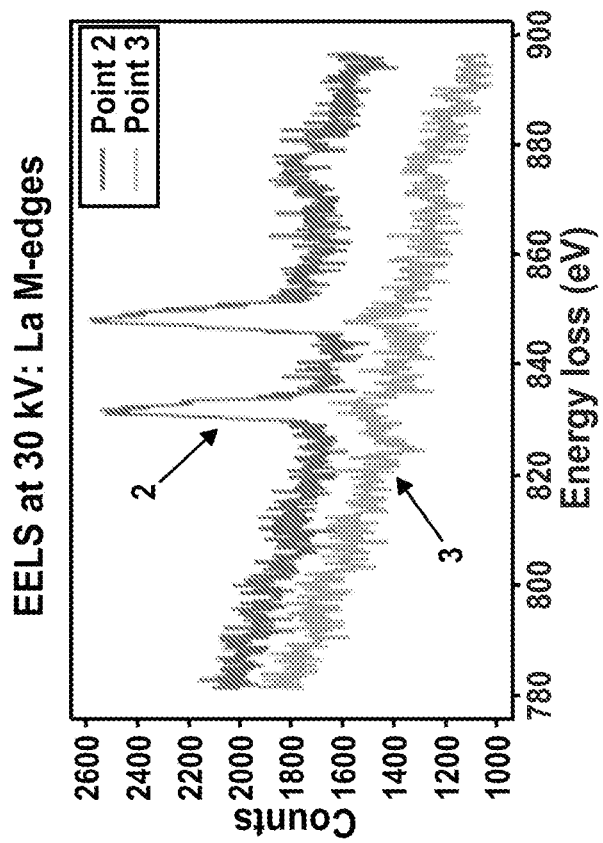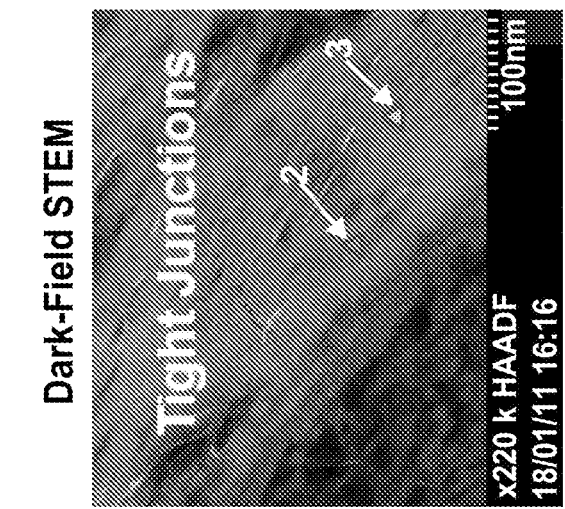
FIG. 8A
FIG. 8B
FIG. 9A
FIG. 9B

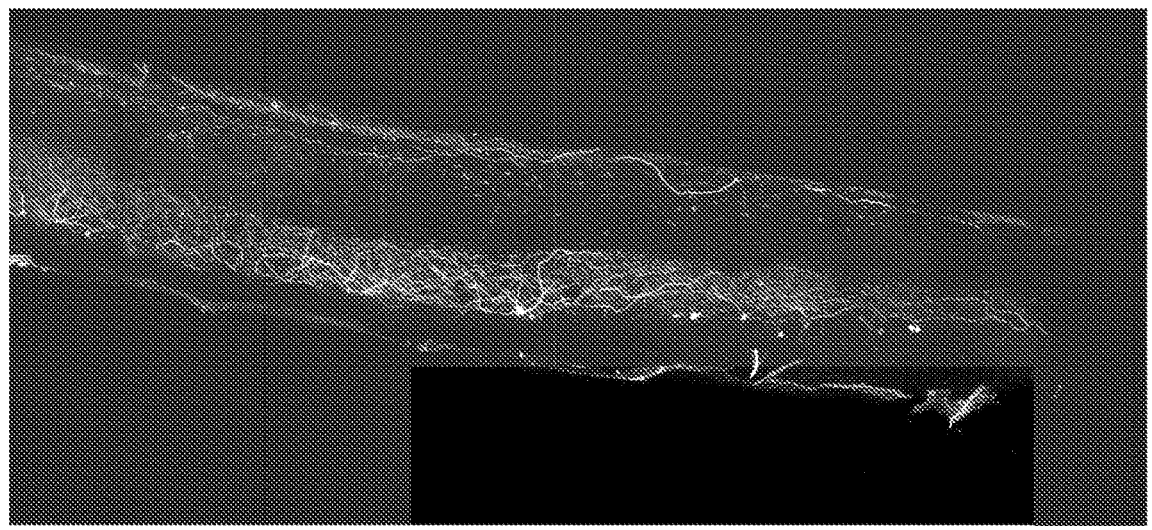
FIG. 10
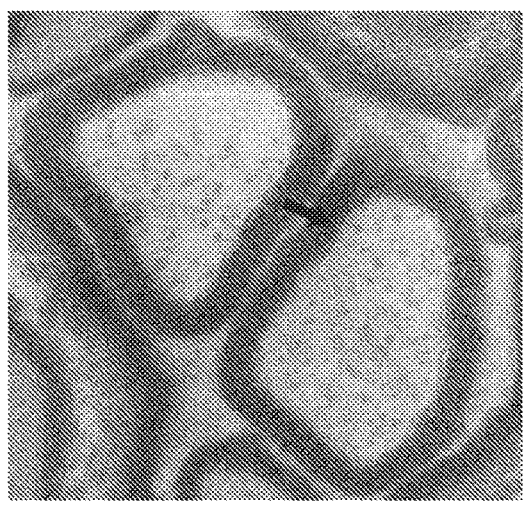 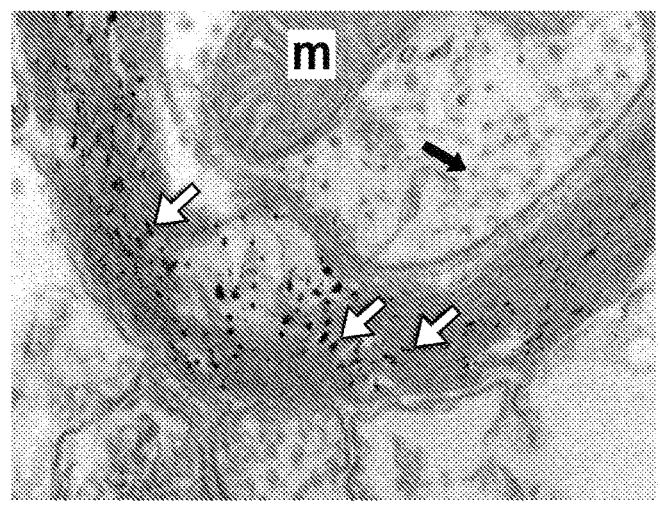
FIG. 11A  FIG. 11B

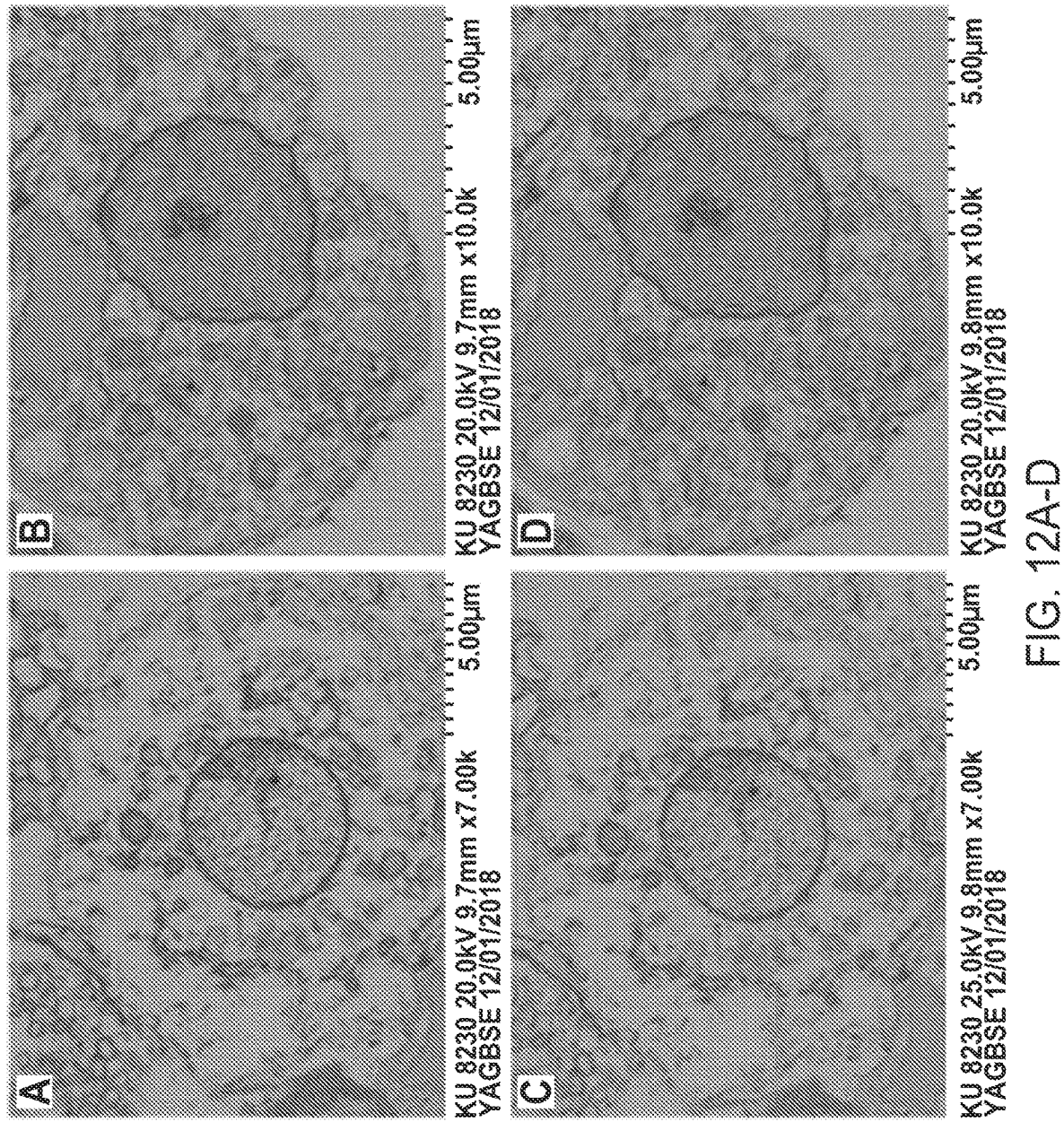
FIG. 12A-D

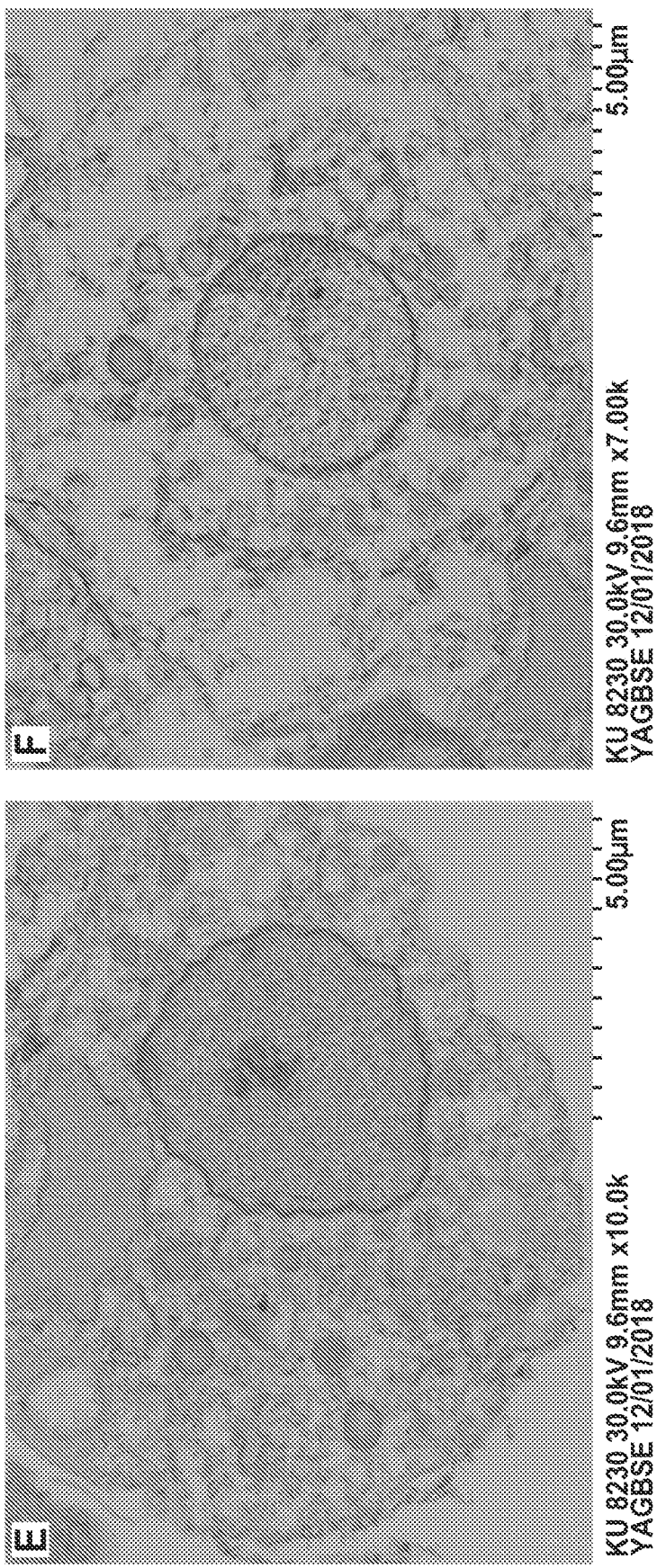
FIG. 12E-F

GRAPHENE BASED SUBSTRATES FOR IMAGING

CROSS-REFERENCE TO RELATED APPLICATIONS

This application is a United States National Phase Patent Application of International Patent Application Number PCT/US2019/065633, filed on Dec. 11, 2019, which claims benefit of U.S. Provisional Application No. 62/778,140, filed Dec. 11, 2018, the contents of which are hereby incorporated herein by reference in their entirety.

TECHNICAL FIELD

This application relates generally to substrates for use in electron microscopy, and methods of making and using the same, particularly for reducing common problems associated with the imaging of biological samples.

BACKGROUND

Electron microscopy, which includes, scanning electron microscopy (SEM), transmission electron microscopy (TEM), analytical electron microscopy (AEM), correlative light and electron microscopy (CLEM), serial section transmission electron microscopy (ssTEM), serial section scanning electron microscopy (ssSEM) serial section scanning transmission electron microscopy (ssSTEM) serial block-face scanning electron microscopy (sBFSEM) and scanning transmission electron microscopy (STEM) can be advantageously used to investigate the ultrastructure of biological samples such as cells and tissue, polymer resin samples, and crystalline samples such as inorganic (e.g., iron, zinc, copper, etc.) substances.

In an electron microscope column, incident electrons are accelerated into, for example, epoxy resin-embedded samples (FIG. 1). A number of interactions between the accelerated electrons and atoms contained within the resin-embedded sample result in elastic and inelastic scattering of electrons (known as the electron interaction volume; FIG. 1). A number of signals generated (i.e., secondary electrons, backscattered electrons, cathodoluminescence, auger electrons, characteristic X-rays, and Bremsstrahlung X-rays) can be used for high-resolution electron microscopic imaging of ultrastructural features of cell and tissue organelles.

There are many complications associated with the imaging of non-conductive samples. It is known, for example, that charging can complicate the imaging samples with low conductivity, such as biological samples. Charging is produced by build-up of electrons in a sample and their uncontrolled discharge. This can produce unwanted artifacts, particularly in secondary electron images. When the number of incident electrons is greater than the number of electrons escaping from the specimen, then a negative charge builds up at the point where the beam hits the sample. This phenomenon is called charging, and it causes a range of unusual effects such as abnormal contrast and image deformation and shift. Sometimes a sudden discharge of electrons from a charged area may cause a bright flash on the screen. These make it impossible to capture a uniform image of the specimen and may even be violent enough to cause small specimens to be dislodged from the mounting stub.

Increasing conductivity without influencing the contrast of the embedding medium can be done by using conductive materials composed of light elements. For example, the use of more conductive substrates to mount the specimens for imaging can improve the image quality by eliminating the charging effects. Thus, there is a need for the development of highly conductive substrates to eliminate charging artifacts resulting from the electron beam in electron microscopy (e.g., TEM, SEM, STEM, AEM, CLEM, ssTEM, ssSEM, ssSTEM, sBFSEM). There is also a need for the development of highly conductive substrates that can be effectively invisible in the resolution range for optical (e.g., bright-field, fluorescence, laser scanning confocal microscopy, and multi-photon microscopy) microscopy to transmit light. There is also a need for methods of using such substrates in imaging technology.

These needs and other needs at least partially satisfied by the present disclosure.

SUMMARY

The present disclosure is directed to an article comprising: a) a substrate comprising a polymer film having a first surface and an opposed second surface; and b) a graphene coating disposed on the first surface of the polymer film; and wherein the article is configured to support a sample for electron or optical microscopy.

In still further aspects, disclosed herein is an article comprising: a) a substrate having a first surface and an opposed second surface; and b) a graphene coating disposed on the first surface of the substrate, and wherein the article is configured to support a sample for electron or optical microscopy. In such aspects, the substrate can comprise a polymer film, a glass, or a metal.

In still further aspects, also disclosed herein are methods of making an article, comprising: a) providing a substrate comprising a polymer film and having a first surface and an opposed second surface; and b) coating at least one layer comprising graphene on the first surface of the substrate; wherein the article is configured to support a sample for electron microscopy.

In still further aspects, disclosed is a method of making an article comprising: a) providing a substrate having a first surface and an opposed second surface; and b) coating at least one layer comprising graphene on the first surface of the substrate; wherein the article is configured to support a sample for electron microscopy. In such aspects, the substrate can comprise a polymer film, a glass, or a metal.

In still further aspects, disclosed herein are methods comprising mounting a ribbon of a specimen on any article described herein and imaging the sample with an electron microscope. In still further aspects, prior to the step of mounting, the specimen is formed by slicing a tissue sample. In still further aspects, the tissue sample can comprise a resin impregnated with cells.

Additional aspects of the disclosure will be set forth, in part, in the detailed description, figures, and claims which follow, and in part will be derived from the detailed description or can be learned by practice of the invention. It is to be understood that both the foregoing general description and the following detailed description are exemplary and explanatory only and are not restrictive of the invention as disclosed.

DESCRIPTION OF DRAWINGS

FIGS. 3A-B depict STEM micrographs of: FIG. 3A-carbon coated Kapton® tape; and FIG. 3B—graphene coated Kapton® tape.

FIGS. 4A-D depict survey and C1s XPS spectra of: FIGS. 4A-B of uncoated Kapton® tape and FIGS. 4C-D of graphene coated Kapton® tape.

FIG. 5A shows an SEM image of uncoated Kapton® tape, FIG. 5B depicts an elemental analysis as measured by the EDS; FIG. 5C shows an EDS spectrum of carbon; FIG. 5D shows an EDS spectrum of oxygen, and FIG. 5E shows an EDS spectrum of nitrogen.

FIG. 6A shows an SEM image of graphene coated Kapton® tape, FIG. 6B depicts an elemental analysis as measured by the EDS; FIG. 6C shows an EDS spectrum of carbon; FIG. 6D shows an EDS spectrum of oxygen, and FIG. 6E shows an EDS spectrum of nitrogen.

FIG. 8A depicts dark-field STEM spectra of twenty-nanometers (20 nm) cross-sections through myelinated axons exposed to lanthanum. Lanthanum is present in tight junctions (arrowheads) located within the outer myelin lamellae of thick myelin sheaths, indicating a possible natural affinity. FIG. 8B depicts La L-series x-ray peak that was acquired simultaneously with electron energy loss spectroscopy (EELS) at point 2 (yellow (a)) and with EDS at point 3 (orange line (b)).

FIG. 9A depicts dark-field STEM spectra of twenty-nanometers (20 nm) cross-section through myelinated axons exposed to lanthanum and imaged using dark-field STEM. Lanthanum is present in tight junctions (arrowheads) located within the outer myelin lamellae of thick myelin sheaths, indicating a possible natural affinity.

FIG. 9B depicts a parallel EELS spectra (Gatan ENFINA system) measured on points 2 (blue) and 3 (orange).

FIG. 10 depicts a thirty-micron (30μ) section of spinal motor neurons retrogradely labeled with 3 kDa Texas Red dextran amine. Sections were mounted on graphene-coated Kapton® tape and imaged using a Leica TCS SPE Laser Scanning Confocal DM6-Q upright microscope.

FIGS. 11A-B depict: FIG. 11A—a transverse electron micrograph of tg:mbp:EGFP-CAAX, in the ventral spinal cord after DAB photoconversion mounted on graphene-coated Kapton® tape imaged using a yttrium aluminum garnet (YAG) scintillator detector for backscatter electrons (precipitates are in the compacted myelin (white arrow) and are absent in the axoplasm (blue)); FIG. 11B—a higher magnification view of transverse electron micrographs of ventral spinal cord of the tg:mbp:EGFP-CAAX, near the Mauthner axons following photoconversion mounted on graphene-coated Kapton® tape and imaged using a yttrium aluminum garnet (YAG) scintillator detector for backscatter electrons (note the specific precipitate within the compacted myelin (white arrows)).

FIGS. 12A-F depict SEM images taken at varying acceleration voltages (20-30 kV) of spinal cord serial sections. Acceleration voltage allows electrons to penetrate the sample; thus, the higher the acceleration voltage, the more penetration into the sample will occur. As a result, cellular ultrastructural details from deeper regions will interfere with the actual surface morphology. This is not the case following the use of a conductive fixative/en bloc stain combined with the reduced graphene tape. Note the excellent image quality at high-accelerating voltages (25-30 kV). Typically, acceleration voltages for biological tissues are between 5 and 20 kV.

DETAILED DESCRIPTION

Figure 1:
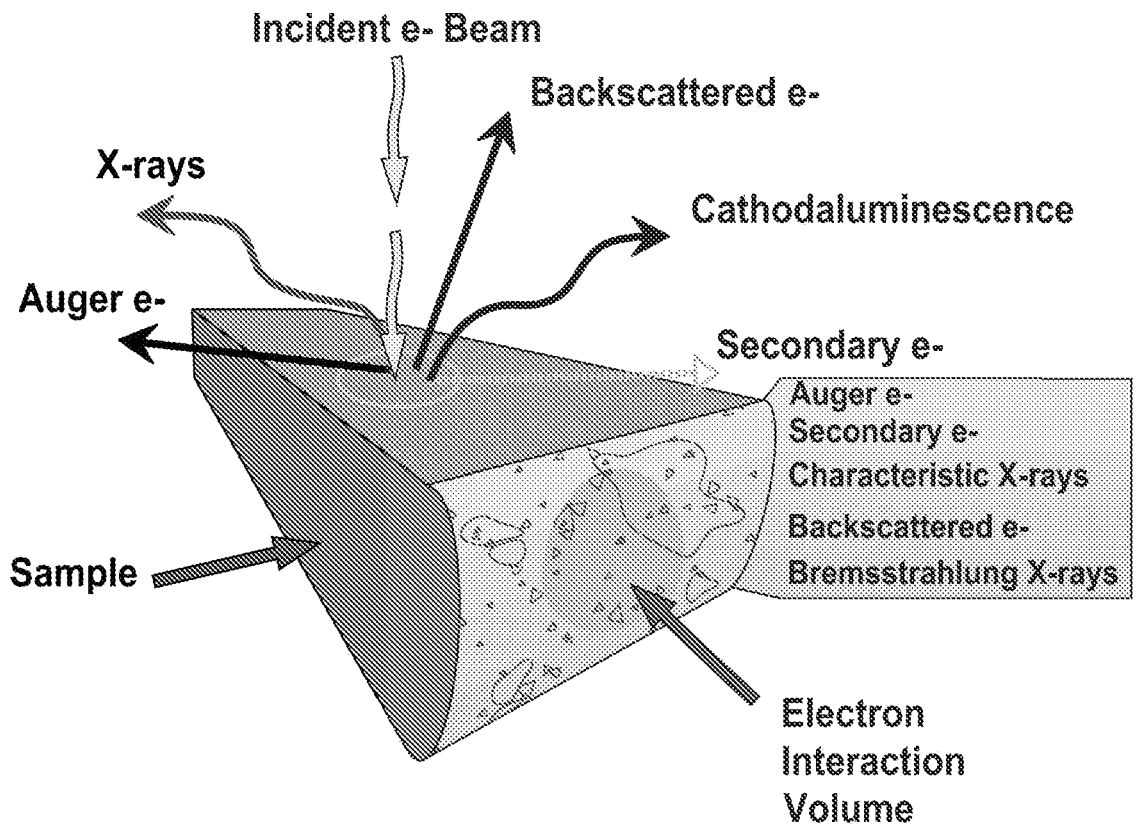
FIG. 1 is a schematic illustration showing electron interaction volume within an epoxy resin embedded sample.

The present invention can be understood more readily by reference to the following detailed description, examples, drawings, and claims, and their previous and following description. However, before the present articles, systems, and/or methods are disclosed and described, it is to be understood that this invention is not limited to the specific or exemplary aspects of articles, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known aspect. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those of ordinary skill in the pertinent art will recognize that many modifications and adaptations to the present invention are possible and may even be desirable in certain circumstances and are a part of the present invention. Thus, the following description is again provided as illustrative of the principles of the present invention and not in limitation thereof.

Definitions

As used herein, the singular forms "a," "an" and "the" include plural referents unless the context clearly dictates otherwise. Thus, for example, reference to a "substrate" includes aspects having two or more such substrates unless the context clearly indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It should be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

References in the specification and concluding claims to parts by weight of a particular element or component in a composition or article, denotes the weight relationship between the element or component and any other elements or components in the composition or article for which a part by weight is expressed. Thus, in a composition or a selected portion of a composition containing 2 parts by weight of component X and 5 parts by weight component Y, X and Y are present at a weight ratio of 2:5, and are present in such ratio regardless of whether additional components are contained in the composition.

A weight percent of a component, unless specifically stated to the contrary, is based on the total weight of the formulation or composition in which the component is included.

As used herein, the term "substantially" can in some aspects refer to at least about 80%, at least about 85%, at least about 90%, at least about 91%, at least about 92%, at least about 93%, at least about 94%, at least about 95%, at least about 96%, at least about 97%, at least about 98%, at least about 99%, or about 100% of the stated property, component, composition, or other condition for which substantially is used to characterize or otherwise quantify an amount.

In other aspects, as used herein, the term "substantially free," when used in the context of a composition or component of a composition that is substantially absent, is intended to refer to an amount that is less than about 1% by weight, e.g., less than about 0.5% by weight, less than about 0.1% by weight, less than about 0.05% by weight, or less than about 0.01% by weight of the stated material, based on the total weight of the composition.

In other aspects, as used herein, the term "substantially free," when used in the context of a film that is substantially free of perorations, for example, is intended to refer to a film or a layer that has less than about 5% of defects, less than about 4.5% of defects, less than about 4% of defects, less than about 3.5% of defects, less than about 3% of defects, less than about 2.5% of defects, less than about 2% of defects, less than about 1.5% of defects, less than about 1% of defects, less than about 0.5% of defects, less than about 0.1% of defects, less than about 0.05% of defects, or less than about 0.01% of defects of the total surface of the film or the layer.

As used herein, the term or phrase "effective," "effective amount," or "conditions effective to" refers to such amount or condition that is capable of performing the function or property for which an effective amount or condition is expressed. As will be pointed out below, the exact amount or particular condition required will vary from one aspect to another, depending on recognized variables such as the materials employed and the processing conditions observed. Thus, it is not always possible to specify an exact "effective amount" or "condition effective to." However, it should be understood that an appropriate effective amount will be readily determined by one of ordinary skill in the art using only routine experimentation.

While aspects of the present invention can be described and claimed in a particular statutory class, such as the system statutory class, this is for convenience only and one of ordinary skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

The present invention may be understood more readily by reference to the following detailed description of various aspects of the invention and the examples included therein and to the Figures and their previous and following description.

Article

In some aspects, described herein is an article comprising: a) a substrate comprising a polymer film having a first surface and an opposed second surface, and b) a graphene coating disposed on the first surface of the polymer film, and wherein the article is configured to support a sample for electron or optical microscopy.

In yet further aspects, disclosed herein is an article comprising a) a substrate having a first surface and an opposed second surface, and b) a graphene coating disposed on the first surface of the polymer film, and wherein the article is configured to support a sample for electron or optical microscopy. In still further aspects, the substrate can comprise a polymer film, a glass, or a metal.

In still further aspects, the substrate of the disclosed article is a polymer film. In yet other aspects, the substrate comprises a glass, a polymer film, or a metal. In still further aspects, the glass substrate can be any glass useful for optical or electronic microscopy. In certain aspects, the glass substrate can comprise glass cover slides. In certain exemplary aspects, the glass substrate can comprise a borosilicate glass or a soda-lime glass. In still further aspects, the substrate can comprise quarts. In still further aspects, when the substrate is the glass substrate, the substrate can have a thickness from about 5 mm to about 60 mm, including exemplary values of about 10 mm, about 15 mm, about 18 mm, about 20 mm, about 22 mm, about 25 mm, about 28 mm, about 30 mm, about 35 mm, about 40 mm, about 45 mm, about 50 mm, and about 55 mm. It is understood that the thickness of the glass substrate can be any thickness between any two foregoing values.

In some aspects, the substrate of the present disclosure can have any shape that is effective to achieve the desired results. In certain exemplary and unlimiting aspects, the substrates can be in the form of disks, squares, triangles, rectangles, hexagons, octagons, pentagons, trapezoids, rhombs, and the like.

In still further aspects, the substrate can comprise a metal. It is understood that the metal can be any metal known in the art. In still further aspects, the metal substrate comprises any metal commonly used in the spectroscopic methods. In certain exemplary aspects, the metal substrate can comprise gold, copper, or nickel. In certain aspects, the metal substrate can comprise a continuous metal film, or a metal mesh, or a metal grid. In such aspects, the term grid generally refers to a flat disc with a mesh or other shaped holes used to support thin sections of the specimen. The holes in the grids allow the electrons to pass through. It is further understood that the grids are commercially available and can have a wide variety of patterns depending on the desired application. In certain aspects, the metal substrate can have a thickness from about 10 microns to about 50 microns, including exemplary values of about 12 microns, about 15 microns, about 18 microns, about 20 microns, about 22 microns, about 25 microns, about 28 microns, about 30 microns, about 32 microns, about 35 microns, about 38 microns, about 40 microns, about 42 microns, about 45 microns, and about 48 microns. It is understood that the metal substrate thickness can be any thickness between any two foregoing values.

In still further aspects, the substrate can be a polymer film. In certain aspects, a type of polymer can depend on the desired application. In certain aspects, the polymer is a polyimide, a polyethylene, a polyester, or a polycarbonate. In still further aspects, the polyimide polymer can comprise a poly(4,4'-oxydiphenylene-pyromellitimide) (or Kapton®). In still further aspects, the polymer is a polycarbonate. In yet still further aspects, the polymer is polyethylene terephthalate (PET). In yet other aspects, the polymer film can have a thickness of from about 2 microns to about 300 microns, including exemplary values of about 5 microns, about 10 microns, about 15 microns, about 20 microns, about 30 microns, about 50 microns, about 100 microns, about 150 microns, about 200 microns, and about 250 microns. It is understood that the polymer film thickness can be any thickness between any two foregoing values.

It is understood, and as described herein, graphene is a carbon material having a crystal structure in which hexagonal skeletons of carbon are spread in a planar form and is one atomic plane extracted from graphite crystals. As described herein, the term graphene includes a single-layer graphene and multilayer graphenes, including two to a hundred layers. The single-layer graphene refers to a sheet of one atomic layer of carbon molecules having $\pi$ bonds.

It is understood that graphene layers described herein can be produced by any known in the art methods. In some aspects, the graphene layers are produced by mechanical exfoliation. In yet other aspects, the graphene layers can be produced by a chemical vapor deposition (CVD). It is understood that the graphenes produced by the CVD can be produced by a high-temperature CVD or by a room-temperature CVD.

In still further aspects, the graphene layers of the present disclosure do not comprise any graphenes produced by mechanical exfoliation or by a high-temperature CVD or by a room-temperature CVD.

In still further aspects, the graphene layer of the present disclosure comprises graphene oxide (GO). It is understood that graphene oxide can be produced by any known in the art methods. In yet other aspects, the article described herein does not comprise a graphene oxide.

In still further aspects, the graphene layer of the current disclosure comprises a reduced graphene oxide (rGO). It is understood that the reduced graphene oxide, as used herein, substantially resembles the pristine graphene in at least its lattice structure. In certain aspects, the reduced graphene oxide can be obtained by any known in the art methods. In certain aspects, the reduced graphene oxide is produced chemically by a reaction with the reducing agents. In certain exemplary aspects, the reducing agent can be a part of a solution. In some exemplary aspects, the solution, including the reducing agent can be an aqueous solution, an organic solution, or an ionic liquid. The solution can include a glycol ether, such as, diethylene glycol monobutyl ether, diethylene glycol n-butyl ether acetate, ethylene glycol n-butyl ether acetate or ethylene glycol monobutyl ether. The reducing agent can be inorganic or organic. In some exemplary aspects, the reducing agent can comprise ascorbic acid, oxalic acid ($C_2H_2O_4$), formic acid (HCOOH), sodium borohydride (NaBH), lithium aluminum hydride (LAIN, sulfite compounds, hydrazine, phosphates, phosphorous acid, or citric acid. The reducing agent can also be an electroactive polymer. In still further exemplary aspects, the reduced graphene oxide can be formed by exposing the graphene oxide to a hydrogen plasma. In yet other unlimiting exemplary aspects, the reduced graphene oxide can be formed by illuminating the graphene oxide with high energy light. In still other unlimiting exemplary aspects, the reduced graphene oxide can be formed by heat treatment of the graphene oxide.

It is understood that the level of GO reduction, and thus resultant conductivity of the produced rGO can be manipulated by altering the concentration of the reducing agent, the type of reducing agent, the temperature, and exposure time of GO to the reducing agent. In still further aspects, the reducing agent can be selectively applied to provide conducting rGO patterns within the insulating GO matrix.

It is understood that the reduced graphene oxide of the present disclosure comprises from about 1% to about 30% by atomic weight of oxygen, including exemplary values of about 1.5%, about 2%, about 2.5%, about 3%, about 3.5%, about 4%, about 4.5%, about 5%, about 5.5%, about 6%, about 6.5%, about 7%, about 7.5%, about 8%, about 8.5%, about 9%, about 9.5%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, and about 29% by atomic weight of oxygen. It is further understood that oxygen can be present in the disclosed reduced graphene oxide in any value between any two foregoing values.

In still further aspects, the reduced graphene oxide, as disclosed herein, is substantially free of defects.

In still further aspects, when the disclosed reduced graphene oxide comprises oxygen, the oxygen can be present as bounded to carbon. In such aspects, the reduced graphene oxide comprises a carbonyl group, a carboxyl group, an epoxy group, or a combination thereof. It is understood that the chemical structure of the reduced graphene oxide can be evaluated by various spectroscopic techniques. For example, and without limitation, by use of XPS (X-ray photoelectron spectroscopy), EDS (Energy Dispersive X-ray Spectroscopy), Raman spectroscopy, etc. Some exemplary spectroscopy data for the exemplary graphene films are shown in FIGS. 4C-D and 6A-E. In yet further aspects, the amount of oxygen can be controlled by a degree of reduction of the graphene oxide and depending on the desired application.

In still further aspects, the reduced graphene oxide can be a multilayer reduced graphene oxide. In such exemplary aspects, the interlayer distance between the layers is greater than or equal to 0.34 nm and less than or equal to 0.5 nm, including exemplary aspects, of about 0.35 nm, about 0.36 nm, about 0.37 nm, about 0.38 nm, about 0.39 nm, about 0.4 nm, about 0.41 nm, about 0.42 nm, about 0.43 nm, about 0.44 nm, about 0.45 nm, about 0.46 nm, about 0.47 nm, about 0.48 nm, and about 0.49 nm.

In still further aspects, the graphene layer present on the disclosure article can have a thickness from about 1 nm to about 5 microns, including exemplary values of about 2 nm, about 5 nm, about 7 nm, about 10 nm, about 15 nm, about 20 nm, about 25 nm, about 30 nm, about 50 nm, about 100 nm, about 150 nm, about 200 nm, about 250 nm, about 300 nm, about 350 nm, about 400 nm, about 450 nm, about 500 nm, about 600 nm, about 700 nm, about 800 nm, about 900 nm, about 1 micron, about 1.1 microns, about 1.2 microns, about 1.3 microns, about 1.4 microns, about 1.5 microns, about 1.6 microns, about 1.7 microns, about 1.8 microns, about 1.9 microns, about 2 microns, about 2.5 microns, about 3 microns, about 3.5 microns, about 4 microns, and about 4.5 microns. It is understood that the graphene layer can have any thickness between any two foregoing values. For example, and without limitation, the thickness of the graphene layer can be about 55 nm, about 102 nm, about 220 nm, about 650 nm, about 950 nm, or about 1.150 microns.

Figure 2:
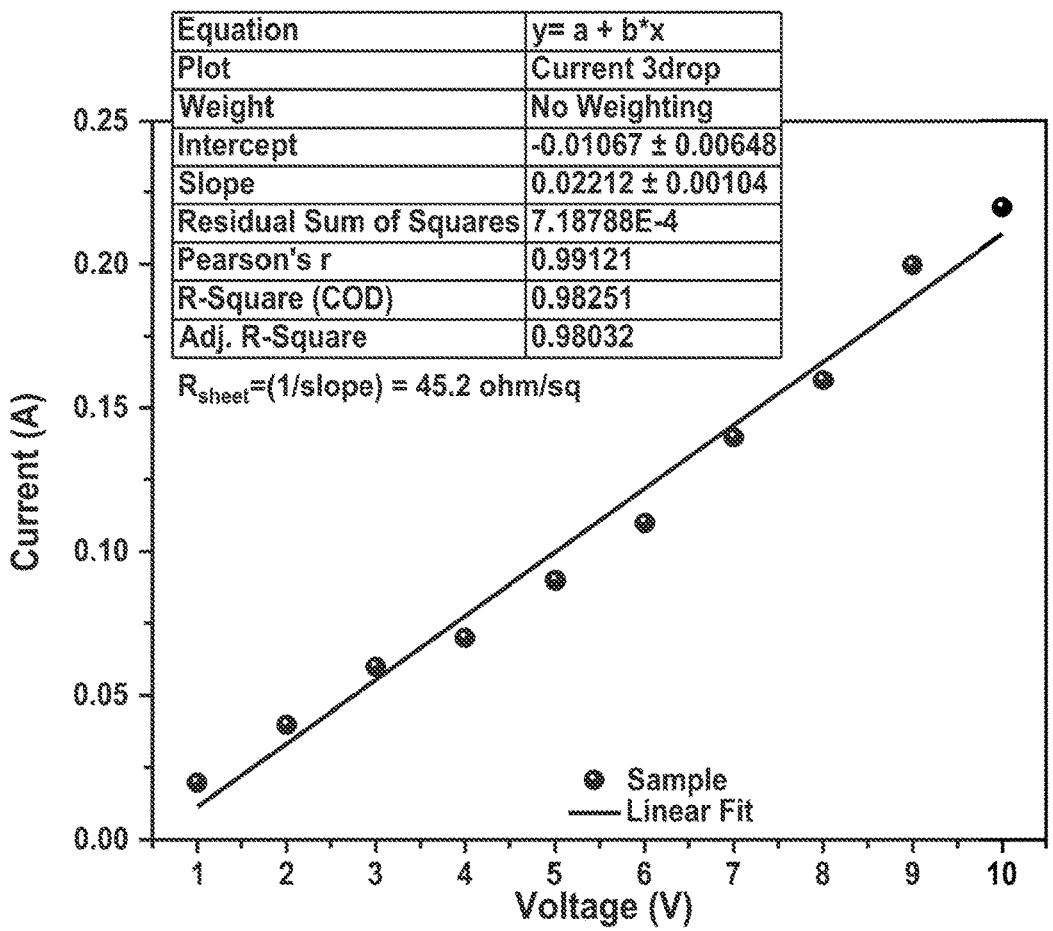
FIG. 2 depicts a sheet resistivity of the coated graphene film.

In still further aspects, the graphene layer disposed can have a sheet resistance of from about 25 Ohm/square to about 100 Ohms/square, including exemplary values about 30 Ohm/square, about 35 Ohm/square, about 40 Ohm/square, about 50 Ohm/square, about 60 Ohm/square, about 70 Ohm/square, about 80 Ohm/square, and about Ohm/square. In yet some exemplary aspects, the sheet resistance is about 45 Ohm/square (FIG. 2).

In still further aspects, the article disclosed herein and having a graphene coating disposed on the substrate can have a sheet resistance of from about 25 Ohm/square to about 100 Ohms/square, including exemplary values about 30 Ohm/square, about 35 Ohm/square, about 40 Ohm/square, about 50 Ohm/square, about 60 Ohm/square, about 70 Ohm/square, about 80 Ohm/square, and about Ohm/square.

In still further aspects, the graphene coating is a substantially uniform film. In such exemplary aspects, the term "uniform film" refers to a film having little to no deviation in the thickness of the film. In still further aspects, the thickness of the film deviates in various spots on the substrate for less than about 5%, less than about 3%, less than about 1%, or less than about 0.5%. In yet further aspects that graphene coating is substantially free of defects.

In still further aspects, the graphene coating is substantially mechanically flexible. In still further aspects, the graphene coating is substantially bendable. In yet other aspects, the article is substantially mechanically flexible. In still further aspects, the article is substantially bendable. In still further aspects, the graphene coating substantially eliminates charging artifacts resulting from an electron beam in electron microscopy. In still further aspects, the graphene coating is effectively invisible in a resolution range for optical microscopy.

Methods

Further described herein are methods of making any of the disclosed above articles. In certain aspects, a method of making article comprises: a) providing a substrate comprising a polymer film and having a first surface and an opposed second surface; and coating at least one layer comprising graphene on the first surface of the substrate; wherein the article is configured to support a sample for electron microscopy. Yet in other aspects, disclosed herein is a method of making an article comprising: a) providing a substrate having a first surface and an opposed second surface; and b) coating at least one layer comprising graphene on the first surface of the substrate; wherein the article is configured to support a sample for electron microscopy. In such exemplary aspects, the substrate can be a polymer film, a glass, or a metal. In still further aspects, the method can comprise any of the disclosed above substrates. In still further aspects, the method can comprise any of the disclosed above graphenes.

In still further aspects, the step of coating the at least one layer comprising graphene can comprise any known in the art methods. In certain exemplary aspects, the step of coating can comprise, epitaxial growth of the graphene on the substrate. In yet other exemplary aspects, the step of coating can comprise a drop casting a composition comprising a reduced graphene oxide on the first surface of the substrate. In yet other aspects, the step of coating can comprise a spin coating of the composition comprising a reduced graphene oxide on the first surface of the substrate.

It is understood that such aspects are exemplary and non-limiting. In still further aspects, the step of coating can be provided by spraying, applying an aerosol, printing (e.g., inkjet printing), electrodepositing, or using a brush to apply the composition comprising a reduced graphene oxide on the first surface of the substrate.

In aspects where the composition is used to coat the layer comprising graphene on the first surface of the substrate, the composition can further comprise a solvent. It is understood that any solvents known in the art effective to provide the desired composition can be utilized. In certain aspects, the solvent can be organic or inorganic.

In certain aspects, the solvent comprises dimethylformamide (DNF), N-methyl-2-pyrrolidone (NMP), ethylene glycol, (EG), alcohol organic solvent (for example, and without limitation, ethanol, isopropanol, n-butanol, etc.), terpenes and derivatives thereof (for example, a terpineol), ester organic solvents (for example, and without limitation, ethyl acetate, butyl acetate, ethylene-propylene acetate, and the like), benzene based organic solvents (for example, and without limitation, methylbenzene, dimethylbenzene and the like), ketone-based organic solvents (for example, and without limitation, cyclohexenone, cyclohexanone, acetone, methylethylketone, butanone and the like), or any combination thereof. In yet further aspects, the solvent can comprise cyclohexenone, a terpineol, isopropanol, or any combination thereof.

In still further aspects, the composition can further comprise additional additives. In such aspects, the additives can comprise surfactant agents, pH stabilizers, reinforcing agents, antifoaming agents, rheology modifiers, thickeners, and the like. It is understood that the additives are selected based on their effect on the quality of the final graphene film. It is also understood that the type of additives and their amounts need to be selected to reduce their impact on the optical, electrical, and mechanical properties of the final graphene coating. In still further aspects, the surfactant can be ionic or nonionic, depending on the solvent. In still further aspects, the composition can further comprise a rheology modifier. It is understood that any known in the art rheology modifiers can be used. In certain exemplary and unlimiting aspects, the rheology modifier can comprise ethyl cellulose, which can serve as a rheology modifier (thickener).

In still further aspects, the reduced graphene oxide is present in the composition in an amount from about 1 mg/mL to about 25 mg/mL, including exemplary values of about 2 mg/mL, about 3 mg/mL, about 4 mg/mL, about 5 mg/mL, about 6 mg/mL, about 7 mg/mL, about 8 mg/mL, about 9 mg/mL, about 10 mg/mL, about 11 mg/mL, about 12 mg/mL, about 13 mg/mL, about 14 mg/mL, about 15 mg/mL, about 16 mg/mL, about 17 mg/mL, about 18 mg/mL, about 19 mg/mL, about 20 mg/mL, about 21 mg/mL, about 22 mg/mL, about 23 mg/mL, and about 24 mg/mL. It is understood that the reduced graphene oxide can be present in the composition in any amount between any two foregoing values. It is still understood that the concentration of the reduced graphene oxide in the composition can be dependent on the specific properties of the final film.

In still further aspects, the composition prior to the step of coating is a uniform suspension. It is understood that to obtain a uniform suspension, any known in the art methods can be utilized, including without limitation, sonication, Vortex mixing, impeller mixing, and the like.

In still further aspects, the substrate is cleaned prior to the step of forming the graphene coating. In such aspects, the cleaning step can be done by any known in the art methods.

The substrate can be cleaned with an organic or inorganic solvent depending on the presence of contaminants to be removed. In still further aspects, prior to the step of forming the graphene coating, the substrate is substantially free of moisture. In such aspects, it is understood that the less than about 10%, less than about 8%, less than about 5%, less than about 1%, less than about 0.5% of the moisture is present on the substrate surface prior to the step of forming the graphene coating. In still further aspects, the substantially free of moisture substrate can be formed by heating the substrate by any known in the art methods. In some aspects, the heating can be done in the conventional ovens, with IR heating, UV heating, or any combination thereof. In certain aspects, the substrate can also be kept in the desiccant to ensure than no re-absorption of moisture can occur.

In still further aspects, the methods disclosed herein comprise heating the article after the step of coating the at least one layer comprising graphene. It is understood that the step of coating and heating can be repeated as many times as desired depending on the use of the article. In still further aspects, the methods disclosed herein comprise repeating the step of coating the at least one conductive carbon layer comprising graphene. In still further aspects, the step of coating can be repeated at least 2 times, at least 3 times, at least 4 times, at least 5 times, at least 6 times, at least 7 times, at least 8 times, at least 9 times, or at least 10 times. In yet other aspects, the step of coating the at least one conductive carbon layer comprising graphene is repeated at least twice to form a total number of three conductive carbon layers comprising graphene.

In still further aspects, the methods further comprise annealing the article at a temperature from about 250-300° C., including exemplary values of about 260° C., about 270° C., about 280° C., and about 290° C. In yet other aspects, the annealing is done for a time period from about 0.5 hours to about 4 hours, including exemplary values of about 1 hour, about 1.5 hours, about 2 hours, about 2.5 hours, about 3 hours, and about 3.5 hours. In still further aspects, the methods further comprise annealing the article at a temperature from about 250-300° C., including exemplary values of about 260° C., about 270° C., about 280° C., and about 290° C., for a time period from about 0.5 hours to about 4 hours, including exemplary values of about 1 hour, about 1.5 hours, about 2 hours, about 2.5 hours, about 3 hours, and about 3.5 hours.

As discussed above, any disclosed herein substrates and graphene coatings can be utilized. It is understood that in aspects where at least one layer comprising graphene is formed, it has a thickness from 1 nm to about 1.5 microns, including exemplary values of about 2 nm, about 5 nm, about 7 nm, about 10 nm, about 15 nm, about 20 nm, about 25 nm, about 30 nm, about 50 nm, about 100 nm, about 150 nm, about 200 nm, about 250 nm, about 300 nm, about 350 nm, about 400 nm, about 450 nm, about 500 nm, about 600 nm, about 700 nm, about 800 nm, about 900 nm, about 1 micron, about 1.1 microns, about 1.2 microns, about 1.3 microns, and about 1.4 microns. It is understood that the graphene layer can have any thickness between any two foregoing values. For example, and without limitation, the thickness of the graphene layer can be about 55 nm, about 102 nm, about 220 nm, about 650 nm, about 950 nm, or about 1.150 microns.

In yet other aspects where three layers comprising graphene are formed, such layers have a total thickness from 1 nm to about 1.5 microns, including exemplary values of about 2 nm, about 5 nm, about 7 nm, about 10 nm, about 15 nm, about 20 nm, about 25 nm, about 30 nm, about 50 nm, about 100 nm, about 150 nm, about 200 nm, about 250 nm, about 300 nm, about 350 nm, about 400 nm, about 450 nm, about 500 nm, about 600 nm, about 700 nm, about 800 nm, about 900 nm, about 1 micron, about 1.1 microns, about 1.2 microns, about 1.3 microns, and about 1.4 microns. It is understood that the graphene layer can have any thickness between any two foregoing values. For example, and without limitation, the thickness of the graphene layer can be about 55 nm, about 102 nm, about 220 nm, about 650 nm, about 950 nm, or about 1.150 microns.

In still further aspects, the at least one layer comprising graphene formed by the methods disclosed herein is a substantially uniform film. In yet other aspects, the at least one layer comprising graphene formed by the methods disclosed herein is substantially free of defects.

In still further aspects, disclosed herein are methods of using the disclosed articles for imaging a sample with an electron microscope. In such aspects, the disclosed methods comprise a) mounting a ribbon of a specimen on any of the disclosed articles and b) imaging the sample with an electron microscope.

It is understood that in aspects disclosed herein, the term "ribbon" refers to a narrow strip of tissue sections sliced from the tissue sample that are continuous or 'stuck together.' It is understood that the length of the ribbon is dependent on the revolutions of the microtome knife and can be determined by one of ordinary skill in the art depending on the desired application.

In still further aspects, the ribbon of the specimen is mounted on the layer comprising graphene of the article. In still further aspects, prior to the mounting, the specimen is formed by slicing a tissue sample.

In certain aspects, the tissue sample comprises a resin impregnated with cells. The tissue sample can be prepared by any known in the art methods. It is understood that as referred herein, the terms "tissue sample and biological sample," unless specified otherwise, are used interchangeably. For example and without limitation, the methods can comprise (i) contacting the biological sample or the tissue sample with buffers and solvents; (ii) contacting the biological sample or the tissue sample with a first polymerizable resin under conditions effective to permit permeation of the polymerizable resin into the biological sample or the tissue sample; (iii) disposing the biological sample or the tissue sample in a volume of a second polymerizable resin; and (iv) heating the so-prepared biological sample or the tissue sample to a temperature effective to cure the first polymerizable resin and the second polymerizable resin, thereby forming a 3-dimensional conductive sample block.

It is understood that the biological sample (or the tissue sample) can be any type of biological sample. Biological samples can be of prokaryotic origin or eukaryotic origin. For example, the biological sample can be originated from a biological subject such as a bacterium, a fungus, a protozoan, an insect, a fish, a bird, a reptile, a mammal (e.g., mouse, rat, cow, dog, donkey, guinea pig, or rabbit), or a primate (e.g., chimpanzee, or human). A biological sample can be obtained or derived from a biological subject by a variety of methods. For example, a biological sample can include tissues or cells isolated from mammals (e.g., humans), or sections of a biological sample (e.g., the sectional portion of an organ or tissue). In some examples, the biological sample can comprise neural cells, embryonic cells, blood cells, skin cells, cardiac cells, liver cells, bone cells, endothelial cells, or pancreatic cells. Other non-limiting examples of biological samples include skin, heart tissue, lung tissue, kidney tissue, bone marrow, bone, breast tissue, pancreas tissue, liver tissue, muscle tissue, smooth muscle tissue, bladder tissue, gall bladder tissue, colon tissue, intestinal tissue, brain tissue, prostate tissue, esophagus tissue, thyroid tissue, spinal cord, and teeth. In one example, the biological sample can comprise a solid tumor. In another example, the biological sample can comprise an interface between a biomaterial and a tissue (e.g., a portion of a medical implant or device and tissue contacting the implant or device).

In some aspects, the method can further comprise contacting the biological sample with a fixation fluid prior to forming the resin. The fixation fluid can comprise an aldehyde (e.g., formaldehyde, paraformaldehyde, glutaraldehyde, or a combination thereof). In some aspects, the fixation fluid can comprise an aqueous solution comprising from 2% to 8% by weight aldehyde (e.g., from 2% to 6% by weight aldehyde), based on the total weight of the fixation fluid.

In some aspects, the fixation can comprise a mixture of two or more aldehydes (e.g., a mixture of glutaraldehyde and paraformaldehyde). In certain aspects, the fixation fluid comprises an aqueous solution comprising from 1% to 3% by weight glutaraldehyde and from 1% to 3% by weight paraformaldehyde.

The aqueous solution used to prepare the biological sample or the tissue sample can further comprise a physiological buffer. The phrase "physiological buffer" refers to a buffered solution at physiological conditions. Examples of physiological buffers include, but are not limited to, phosphate-buffered saline (PBS), Hanks' Balanced Salt Solution (HBBS), Ringer's solution, and Dulbecco's modified Eagle's medium (DMEM).

In still further aspects, the biological samples, or cells, can be rinsed with a buffer comprising (4-2-hydroxyethyl)-1-piperazineethanesulfonic acid) (HEPES). In still further aspects, the cells can be rinsed with or additional buffers such as cacodylate buffer. The dehydration solvents can comprise ethanol, methanol, and acetone. Dehydration solvents can be anhydrous for embedding tissues, etc. when using epoxy resins. Type 3A molecular sieves can be used to dry acetone, ethanol, and methanol.

In some aspects, the solution can further comprise an oxidizing fixative, such as osmium tetroxide, ruthenium tetroxide, and/or platinum blue. The oxidizing fixative can comprise from 0.5% to 5% by weight of the solution, such as from 2% to 3% by weight of the solution.

In some aspects, the solution can further comprise a negative stain, such as a uranium salt, a ruthenium salt, a platinum salt, a lead salt, or a combination thereof. The negative stain can comprise from 0.5% to 8% by weight of the solution, such as from 2% to 6% by weight of the solution. In some cases, the solution can further comprise a uranium salt, such as uranyl acetate ruthenium salts, such as ruthenium tetroxide, and/or platinum salts, such as platinum blue. In some cases, the solution can further comprise a lead salt, such as lead citrate. In certain aspects, the solution can comprise from 3% to 5% by weight uranyl acetate, ruthenium tetroxide, and/or platinum blue, and from 0.1% to 1% by weight lead citrate, based on the total weight of the solution.

In some aspects, the solution can further comprise a mordant, such as tannic acid. The mordant can comprise from 0.01% to 1% by weight of the solution, based on the total weight of the solution.

In some aspects, the solution can further comprise p-phenylenediamine, such as from 0.1% to 2% by weight p-phenylenediamine, based on the total weight of the solution.

In some aspects, the solution can further comprise a lanthanum salt (e.g., lanthanum nitrate), such as from 0.5% to 6% by weight lanthanum salt (e.g., lanthanum nitrate), based on the total weight of the solution.

The first polymerizable resin and the second polymerizable can each independently be any resin known for use in embedding samples (e.g., biological samples such as cells and tissue) for analysis by electron microscopy. In some cases, first polymerizable resin and the second polymerizable can each independently comprise an epoxy resin (e.g., a water-soluble epoxy resin).

The term "epoxy resin" is meant to include any material or compound having one or more oxirane rings that are capable of undergoing polymerization. As such, this term encompasses epoxy-containing monomers, epoxy-containing oligomers, and epoxy-containing crosslinking agents. The singular form of the term is intended to include the plural form of the term. Oligomeric and multifunctional epoxy materials can also be used as epoxy resins.

Epoxy resins can comprise organic compounds having at least one oxirane ring, which oxirane ring is shown in the following formula:

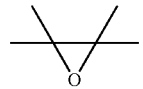

that is polymerizable by a ring opening mechanism. Such epoxy resins that are also called "epoxides" include monomeric epoxy compounds and epoxides of the polymeric type and can be aliphatic, cycloaliphatic, aromatic, or heterocyclic. These materials generally have, on the average, at least one polymerizable epoxy group per molecule, or typically at least about 1.5 and even at least about 2 polymerizable epoxy groups per molecule. Polymeric polymerizable epoxy materials include linear polymers having terminal epoxy groups (for example, a diglycidyl ether of a polyoxyalkylene glycol), polymers having skeletal (backbone) oxirane units (for example, a polybutadiene polyepoxide), and polymers having pendant epoxy groups (for example, a glycidyl methacrylate polymer or copolymer).

The epoxy resins can be single compounds, or they can be mixtures of different epoxy materials containing one, two, or more epoxy groups per molecule. The "average" number of epoxy groups per molecule is determined by dividing the total number of epoxy groups in the epoxy material by the total number of epoxy-containing molecules present.

The epoxy resins can vary from low molecular weight monomeric materials to high molecular weight polymers, and they can vary greatly in the nature of the backbone and substituent (or pendant) groups. For example, the backbone can be of any type, and substituent groups thereon can be any group that does not substantially interfere with cationic photocuring process desired at room temperature and does not negatively impact subsequent imaging by electron microscopy. Illustrative of substituent groups include but are not limited to, halogens, ester groups, ethers, sulfonate groups, siloxane groups, nitro groups, and phosphate groups. The molecular weight of the epoxy materials can be at least 58 and up to and including 100,000 or even higher.

Useful epoxy resins include those that contain cyclohexene oxide groups such as epoxycyclohexane carboxylates, such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, and bis(3,4-epoxy- 6-methylcyclohexylmethyl) adipate. Still other useful epoxy resins include glycidyl ether monomers that are glycidyl ethers of polyhydric phenols obtained by reacting a polyhydric phenol with an excess of chlorohydrin such as epichlorohydrin [for example, the diglycidyl ether of 2,2-bis-(2,3-epoxypropoxyphenol)-propane].

Many commercially available epoxy resin are known, including glycidyl ethers such as bisphenol-A-diglycidyl ether (DGEBA), glycidyl ethers of bisphenol S and bisphenol F, butanediol diglycidyl ether, bisphenol-A-extended glycidyl ethers, phenol-formaldehyde glycidyl ethers (epoxynovolacs) and cresol-formaldehyde glycidyl ethers (epoxy cresol novolacs), epoxidized alkenes such as 1,2-epoxyoctane, 1,2,13,14-tetradecane diepoxide, 1,2,7,8-octane diepoxide, octadecylene oxide, epichlorohydrin, styrene oxide, vinyl cyclohexene oxicyclohexene oxide, glycidol, glycidyl methacrylate, diglycidyl ether of Bisphenol A (for example, those available under the EPON trademark such as Epon™ 812, from Shell Chemical Co., Epon™ 828, Epon™ 825, Epon™ 1004, and Epon™ 1010 from Momentive, EMbed™ 812 from Electron Microscopy Services, Eponate 12™ from PELCO, DER-331, DER-332, and DER-334 resins from Dow Chemical Co.), vinyl cyclohexene dioxide (for example, ERL-4206 resin from Polyscience), 3,4-epoxycyclohexylmethyl-3,4-epoxycyclohexene carboxylate (for example, ERL-4221, CYRACURE™ 6110, or CYRACURE™ 6105 monomers from Dow Chemical Corp.), 3,4-epoxy-6-methylcyclohexyl-methyl-3,4-epoxy-6-methyl-cyclohexene carboxylate (for example, from Pfaltz and Bauer), bis(3,4-epoxy-6-methylcyclohexylmethyl) adipate, bis(2,3-epoxy-cyclopentyl) ether, aliphatic epoxy modified with polypropylene glycol, dipentene dioxide, epoxidized polybutadiene (for example, Oxiron 2001 resin from FMC Corp.), silicone resin containing epoxy functionality, flame retardant epoxy resins (for example, DER-580 resin, a brominated bisphenol type epoxy resin available from Dow Chemical Co.), 1,4-butanediol diglycidyl ether of phenol formaldehyde novolak (for example, DEN-431 and DEN-438 resins from Dow Chemical Co.), resorcinol diglycidyl ether, bis(3,4-epoxycyclohexyl) adipate (for example, CYRACURE™ resin from Dow Corning Corp.), 2-(3,4-epoxycyclohexyl-5,5-spiro-3,4-epoxy)cyclohexane-meta-dioxane, vinyl cyclohexene monoxide, 1,2-epoxyhexadecane (for example, CYRACURE™ resin from Dow Corning Corp.), alkyl glycidyl ethers such as HELOXY™ Modifier 7 and HELOXY™ Modifier 8 (from Momentive), butyl glycidyl ether (for example, HELOXY™ Modifier 61 from Momentive), cresyl glycidyl ether (for example, HELOXY™ Modifier 62 from Momentive), p-tert butylphenyl glycidyl ether (for example, HELOXY™ Modifier 65 from Momentive), polyfunctional glycidyl ethers such as diglycidyl ether of 1,4-butanediol (for example, HELOXY™ Modifier 67 from Momentive), diglycidyl ether of neopentyl glycol (for example, HELOXY™ Modifier 68 from Momentive), diglycidyl ether of cyclohexanedimethanol (for example, HELOXY™ Modifier 107 from Momentive), trimethylol ethane triglycidyl ether (for example, HELOXY™ Modifier 44 from Momentive), trimethylol propane triglycidyl ether (for example, HELOXY™ Modifier 48 from Momentive), polyglycidyl ether of an aliphatic polyol (for example, HELOXY™ Modifier 84 from Momentive), polyglycol diepoxide (for example, HELOXY™ Modifier 32 from Momentive), bisphenol F epoxides (for example, EPN-1138 or GY-281 resin from Huntman Advanced Materials), and 9,9-bis>4-(2,3-epoxypropoxy)-phenyl fluorenone (for example, Epon™ 1079 resin from Momentive).

Still other epoxy resins are known, such as copolymers derived from acrylic acid esters reacted with glycidol such as glycidyl acrylate and glycidyl methacrylate, copolymerized with one or more ethylenically unsaturated polymerizable monomers. Examples of such copolymers are poly (styrene-co-glycidyl methacrylate) (50:50 molar ratio), poly (methyl methacrylate-co-glycidyl acrylate) (50:50 molar ratio), and poly(methyl methacrylate-co-ethyl acrylate-co-glycidyl methacrylate) (62.5:24:13.5 molar ratio). Other epoxy resins include epichlorohydrins such as epichlorohydrin, alkylene oxides such as propylene oxide and styrene oxide, alkenyl oxides such as butadiene oxide, and glycidyl esters such as ethyl glycidate. Other epoxy materials include silicones having an epoxy functionality or group such as cyclohexylepoxy groups, especially those epoxy materials having a silicone backbone. Commercial examples of such epoxy resins include UV 9300, UV 9315, UV 9400, UV 9425 silicone materials that are available from Momentive.

Polymeric epoxy resins can optionally contain other functionalities that do not substantially interfere with cationic photocuring of the photopolymerizable composition at room temperature and do not adversely impact imaging by electron microscopy. For example, the epoxy materials can also include free-radically polymerizable functionality, as described in more detail below. For example, the epoxy material can also contain free-radically polymerizable functionality in the same molecule. Thus, such epoxy materials can include one or more epoxy groups as well as one or more ethylenically unsaturated polymerizable bonds. For example, multi-polymerizable functioning materials can be obtained by reacting a di- or poly-epoxide with one or more equivalents of an ethylenically unsaturated carboxylic acid. Examples of such reaction products include the reaction product of VR-6105 or DER 332 (available from Dow Chemical Co.) with one equivalent of methacrylic acid. Commercially available materials having both one or more epoxy groups and free-radically polymerizable functionalities include the Cyclomer compounds, such as Cyclomer M100 or M101 (available from Daicel Chemical, Japan).

The epoxy resin can comprise a blend or mixture of two or more different epoxy materials. Examples of such blends include two or more molecular weight distributions of epoxy materials, such as a blend of one or more low molecular weight (below 200) epoxy materials with one or more intermediate molecular weight (from 200 to 10,000) epoxy materials, or one or more of such epoxy materials with one or more higher molecular weight (above 10,000) epoxy materials. Alternatively or additionally, the epoxy resin can comprise a blend of epoxy materials having different chemical natures, such as aliphatic and aromatic natures, or different functionalities, such as polar and non-polar properties. Other cationically polymerizable monomers or polymers can additionally be incorporated into the epoxy resin.

In some aspects, the first polymerizable resin can comprise an epoxy resin (e.g., a water-soluble epoxy resin), such as a bisphenol A-epichlorhydrin epoxy resin.

In some aspects, the second polymerizable resin can comprise an epoxy resin (e.g., a water-soluble epoxy resin), such as a bisphenol A-epichlorhydrin epoxy resin.

In certain aspects, the first polymerizable resin, the second polymerizable, or a combination thereof, can comprise a bisphenol-A-epichlorhydrin epoxy resin (e.g., having a number average molecular weight≤700).

In some aspects, the second polymerizable resin can further comprise an accelerator, such as 2,4,6-Tris(dimethylaminomethyl)phenol (DMP-30), benzyl dimethylamine (BDMA), or a combination thereof.

Still further so-prepared biological sample or the tissue sample can be heated to a temperature of at least about 40° C. to about 80° C., including exemplary values of about 45° C., about 50° C., about 55° C., about 60° C., about 65° C., about 70° C., and about 75° C.

Also provided are methods for imaging biological samples, such as cells and tissues. The methods can comprise preparing the biological sample for microanalysis using a method described herein, thereby forming a 3-dimensional conductive sample block; physically sectioning the 3-dimensional conductive sample block to obtain one or more sample sections; and imaging the one or more sample sections via electron microscopy. Physically sectioning the 3-dimensional conductive sample block can comprise, for example, microtoming the 3-dimensional conductive sample block. The electron microscopy can comprise scanning electron microscopy or transmission electron microscopy. In certain aspects, the electron microscopy can comprise SEM and TEM. In certain aspects, the electron microscopy can comprise ssSEM, sSTEM, or sBFSEM.

In still further aspects, the resin can be trimmed to any desired form and size. In some exemplary aspects, the resin has a substantially cylindrical form having a length from about 100 microns to about 200 microns, including exemplary values of about 120 microns, about 150 microns, and about 180 microns, and a height from about 200 microns to about 300 microns, including exemplary values of about 220 microns, about 250 microns, and about 280 microns.

In certain aspects, the steps of the disclosed methods, such as the steps of slicing, mounting, and imaging can be performed automatically. In still further aspects, the disclosed steps can be performed continuously.

In certain aspects, the slicing is performed in a slicing direction using a microtome knife to provide the at least one specimen section having a predetermined section thickness, wherein the section thickness is controlled by the advancement of the microtome knife into the tissue sample in a substantially perpendicular direction relative to the slicing direction.

In still further aspects, the methods comprise a feedback loop controlling the advancement of the microtome knife to provide the predetermined section thickness. In certain aspects, the predetermined section thickness is less than about 150 nm, less than about 100 nm, less than about 80 nm, less than about 50 nm, or less than about 20 nm. In yet further aspects, the predetermined section thickness is from about 10 nm to about 150 nm, including exemplary values of about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about 95 nm, about 100 nm, about 110 nm, about 120 nm, about 130 nm, and about 140 nm.

In yet other aspects, the ribbon can comprise from about 10 to about 30 specimen sections, including exemplary values of about 11, about 12, about 13, about 14, about 15, about 16, about 17, about 18, about 19, about 20, about 21, about 22, about 23, about 24, about 25, about 26, about 27, about 28, and about 29 specimen sections.

Figure 13:
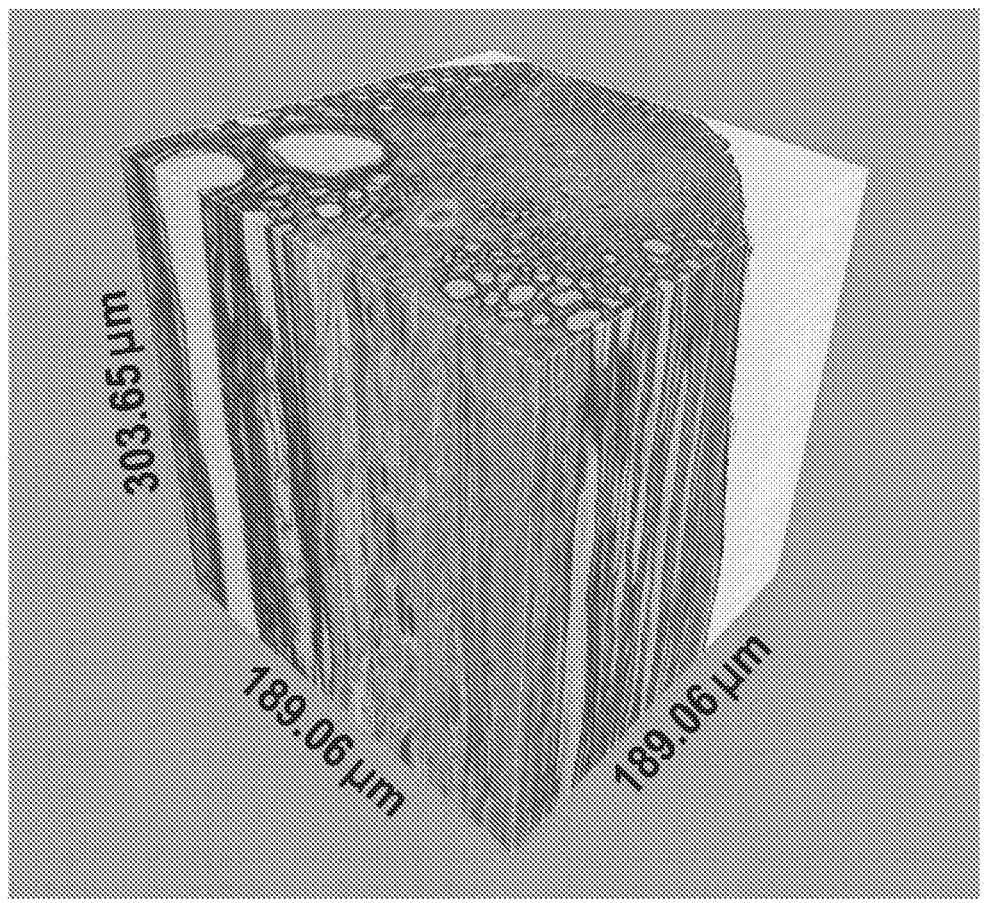
FIG. 13 depicts an image stack composed of 300 serial images (50 nm section thickness) of the fish spinal cord fixed and en bloc stained using a conductive fixative/en bloc stain cut in cross-section. These epoxy-embedded serial section images were obtained using the GATAN 3-View™ ssBFSEM system. Note the excellent registration between all images within the image stack.

In still further aspects, the step of imaging provides a 3D image of the tissue sample. In still further aspects, an exemplary 3D TEM reconstruction image of the tissue sample is shown in FIG. 13.

It is understood that the methods described herein are not limited to the TEM or SEM imaging, and other known in the art microscopic methods can be utilized. For example, the imaging can also be done with a TEM, SEM, AEM, CLEM, ssTEM, ssSEM, ssSTEM, sBFSEM, STEM. sBFSEM is a recent microscopy technique that shows great promise for histology and neuroanatomical research by allowing the 3-dimensional reconstruction of relatively large regions of tissue in a "block" form and cell arrays at near nanometer-scale resolution. sBFSEM employs an automated ultramicrotome fitted into a scanning electron microscope to image a tissue block-face. Samples are prepared by methods similar to those in transmission electron microscopy, typically by staining the specimen then embedding in an epoxy resin. The resin commonly used to immobilize, protect, and establish volume uniformity is an insulating material. In sBFSEM, successive slices are removed from the targeted tissue, or the tissue position is changed to change the focus depth in the block, and an electron beam is scanned over the remaining block-face or at the new focus depth to produce electron backscatter images. sBFSEM is useful, for example, to study the 3D ultrastructure of astrocytes, neurons, and synapses.

By way of non-limiting illustration, examples of certain aspects of the present disclosure are given below.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is degrees C. or is at ambient temperature, and pressure is at or near atmospheric.

Example 1

To form a graphene coating, a graphene nano-ink was first prepared. To prepare the graphene nano-ink, an 85% by volume of cyclohexanone was mixed with 15% by volume of terpineol (both from Sigma Aldrich). The solvent mixture was mixed with reduced graphene oxide (also from Sigma Aldrich) in a 6 mg/mL ratio. Then, a 3 mg/mL ethyl cellulose was added to the mixture (ethyl cellulose was purchased from Sigma Aldrich). The mixture was bath sonicated overnight with temperature not exceeding 40° C. The mixture was then probe sonicated for 15 minutes, and Vortex mixed for about 5 minutes. The formed suspension ("graphene nano-ink") was uniform and served as a reservoir for coating.

To form the graphene coating, 50 µL of the above "graphene nano-ink" was first mixed with 5 mL of isopropanol. The "graphene nano-ink" and isopropanol were mixed using a sonicator (the vial lid kept closed completely to avoid any mechanically-thermally-induced evaporation of isopropanol) to produce a diluted "graphene nano-ink."

Example 2

First, the Kapton Tape®, Schott D 263® M Cover Glass (18, 22, 25, 50 mm), or uncoated gold (Au), copper (Cu), or nickel (Ni) slotted grids were prebaked at 65° C. to desorb any moisture on their surface. Then, prior to the coating graphene nano-ink on the substrate, the Kapton® tape, Schott D 263® M Cover Glass (18, 22, 25, 50 mm), or uncoated gold (Au), copper (Cu), or nickel (Ni) slotted grids were cleaned with acetone and methanol respectively and dried with nitrogen gun.

A Kapton® tape (from 5 cm to 300 m long, 0.5-mil Polyimide [Kapton®] Film No Adhesive 6.4 mm [¼"] wide×33 m [36 yd] long (PIT0.5N/6.4)), Schott D 263® M Cover Glass (18, 22, 25, 50 mm), or uncoated gold (Au), copper (Cu), or nickel (Ni) slotted grids was mounted on a three-dimensional (3D)-printed platform (XVICO 3D Printers Pro DIY Kit Aluminum Printing Machine with Filament Run Out Detection Sensor and Resume Print Metal Base Desktop 3D Printer UL Power for Home and School 220× 220×250 mm, Black). The film can also be supported with vertical supports to ensure that the film is kept flat.

Figure 3A:
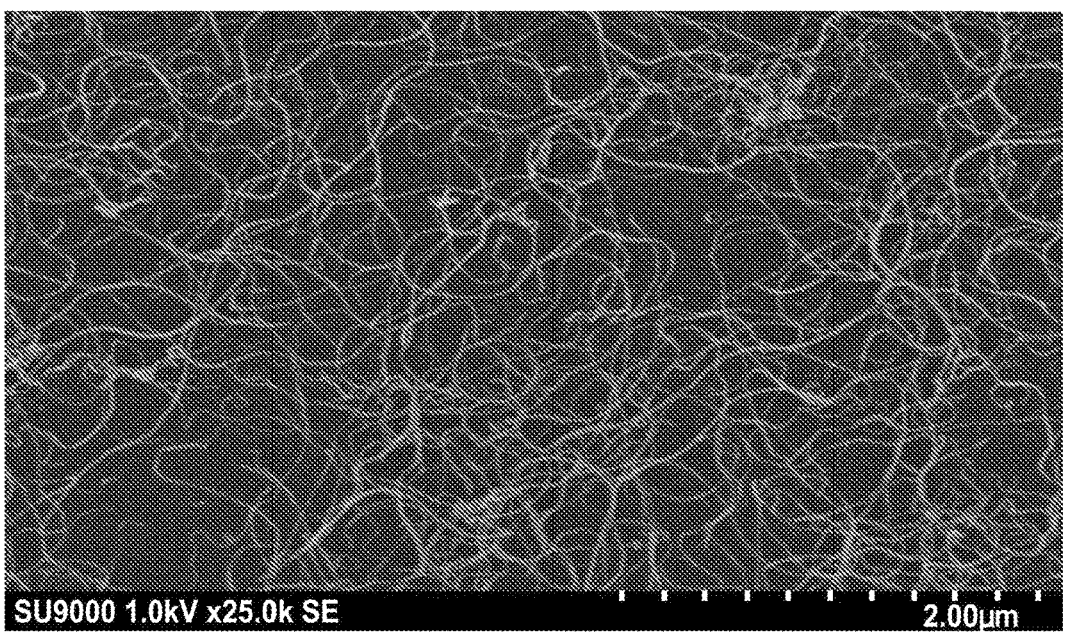
Figure 3B:
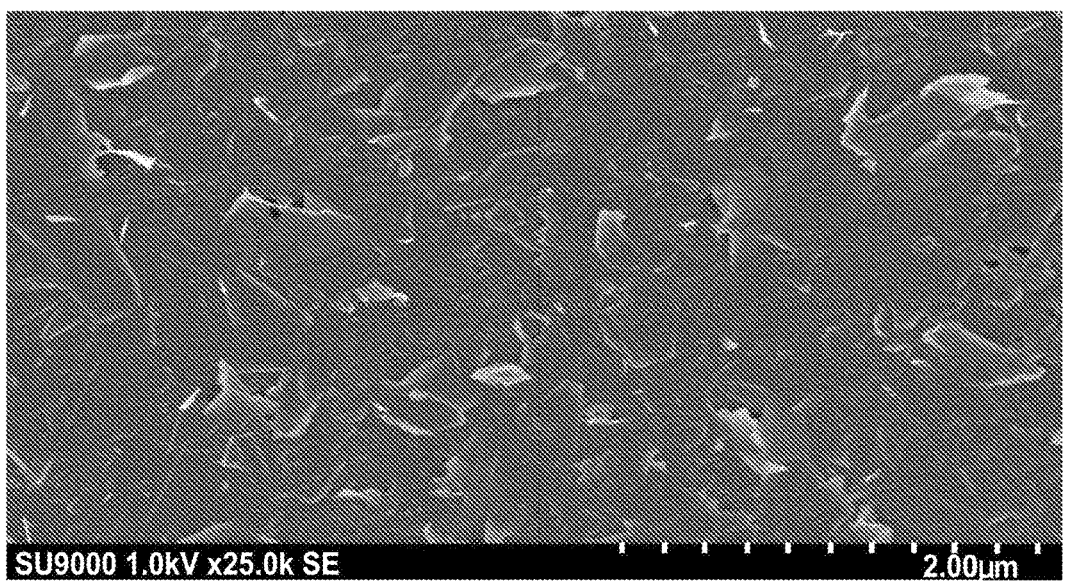

A 10 µL volume of the (diluted) "graphene nano-ink" was drawn from the vial and was drop cast onto the Kapton® tape, Schott D 263® M Cover Glass (18, 22, 25, 50 mm), or uncoated gold (Au), copper (Cu), or nickel (Ni) slotted grids. The coating was dried for 15 minutes. The drop casting and subsequent drying for 15 min were repeated two more times. The final coated film was first air-dried for several hours (typically 5-6 hours) and then annealed at 300° C. for 2 hours in an argon atmosphere. The STEM micrographs comparing surfaces of carbon-coated and graphene-coated Kapton® films are shown in FIGS. 3A-B.

Example 3

Figure 4A:
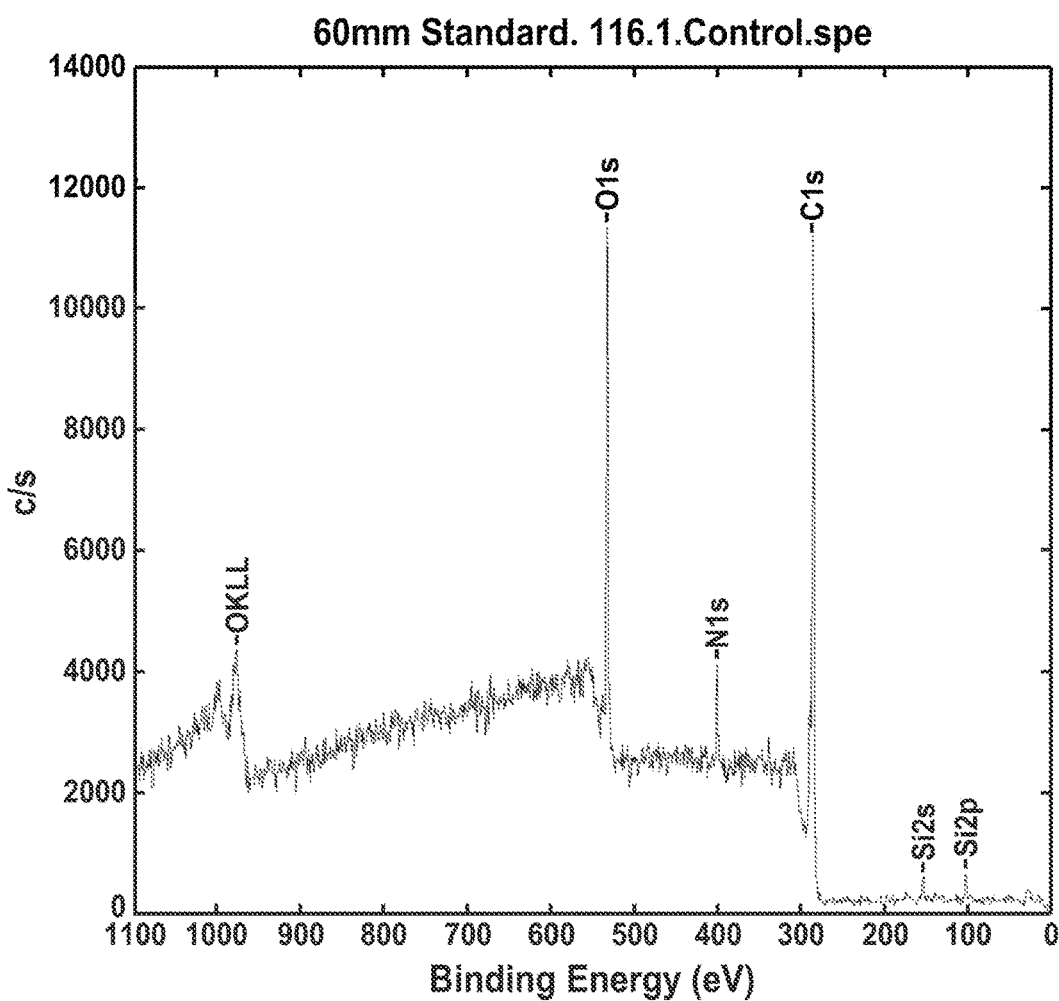
Figure 4B:
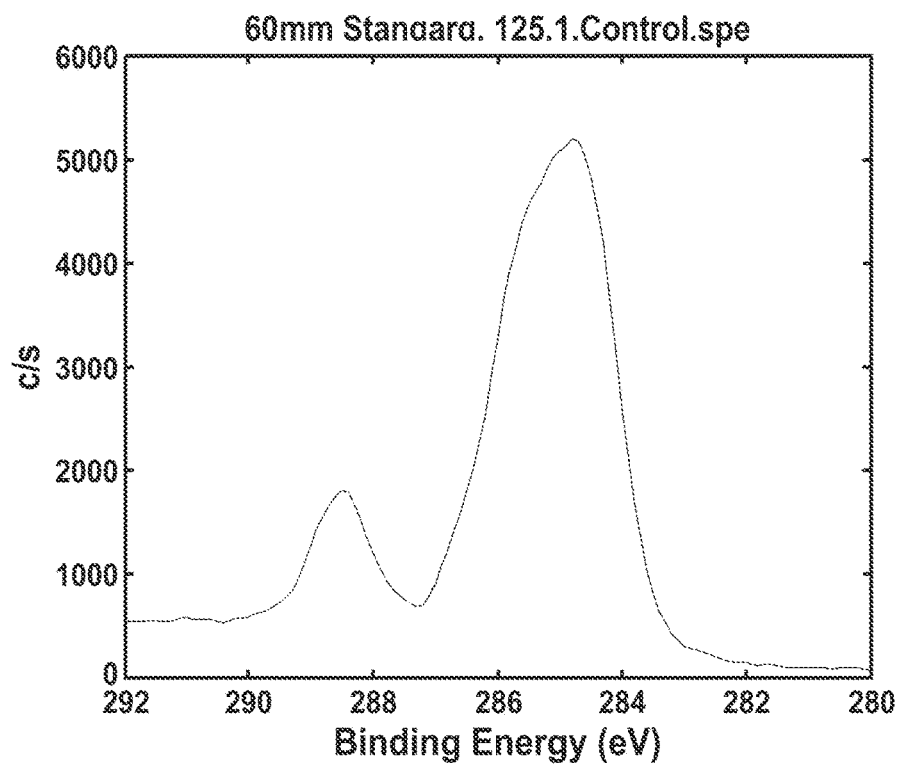
Figure 4C:
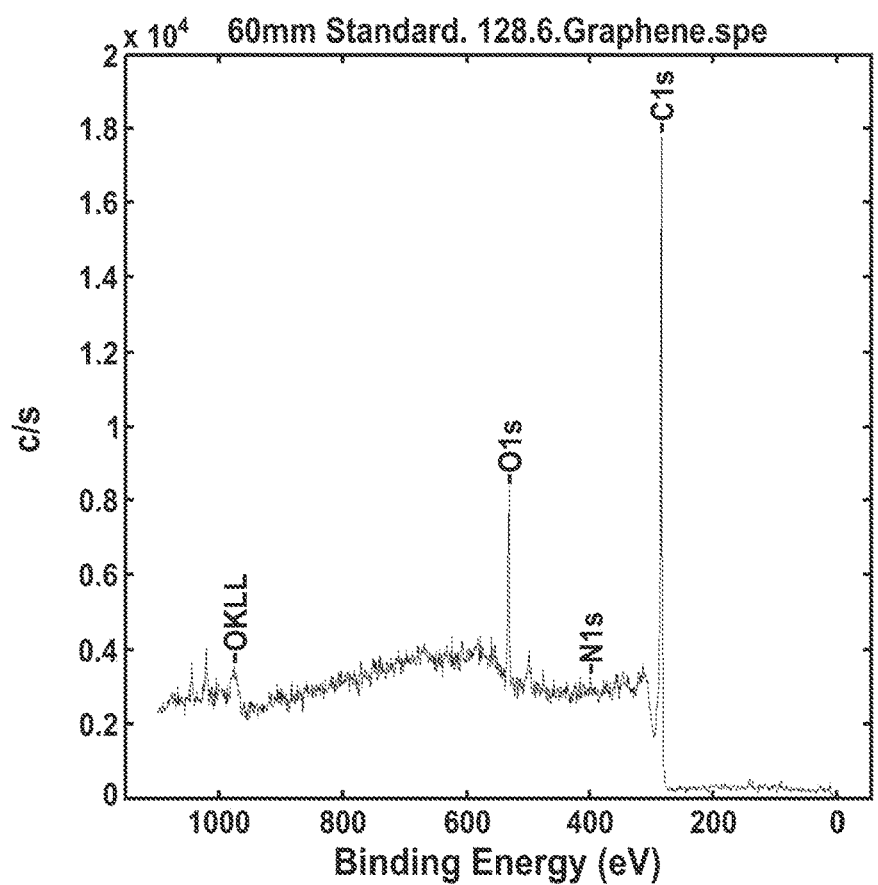
Figure 4D:
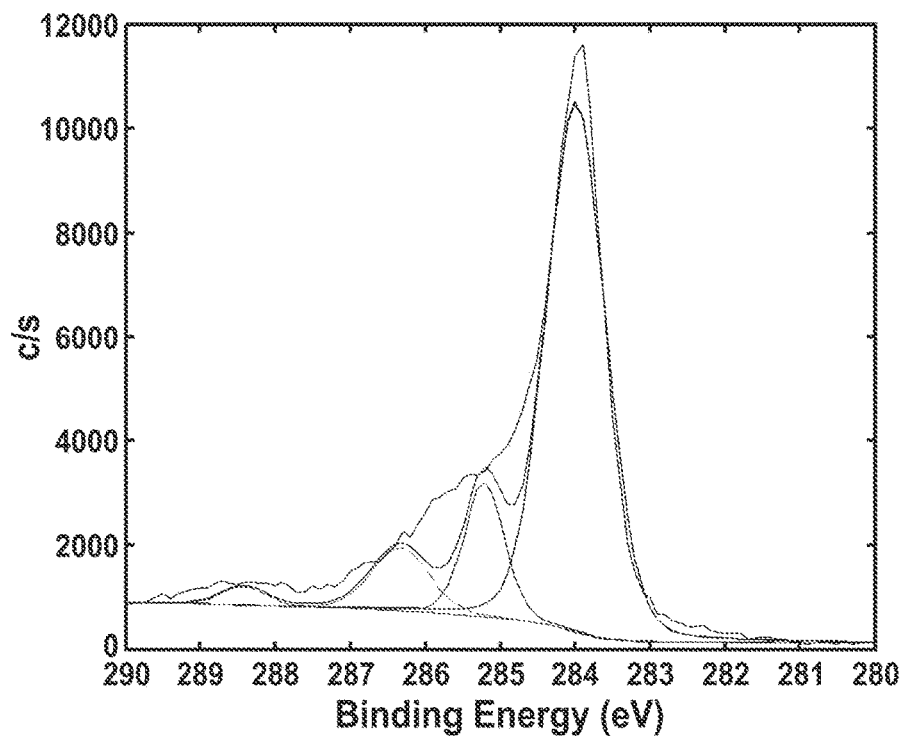
Figure 5A:
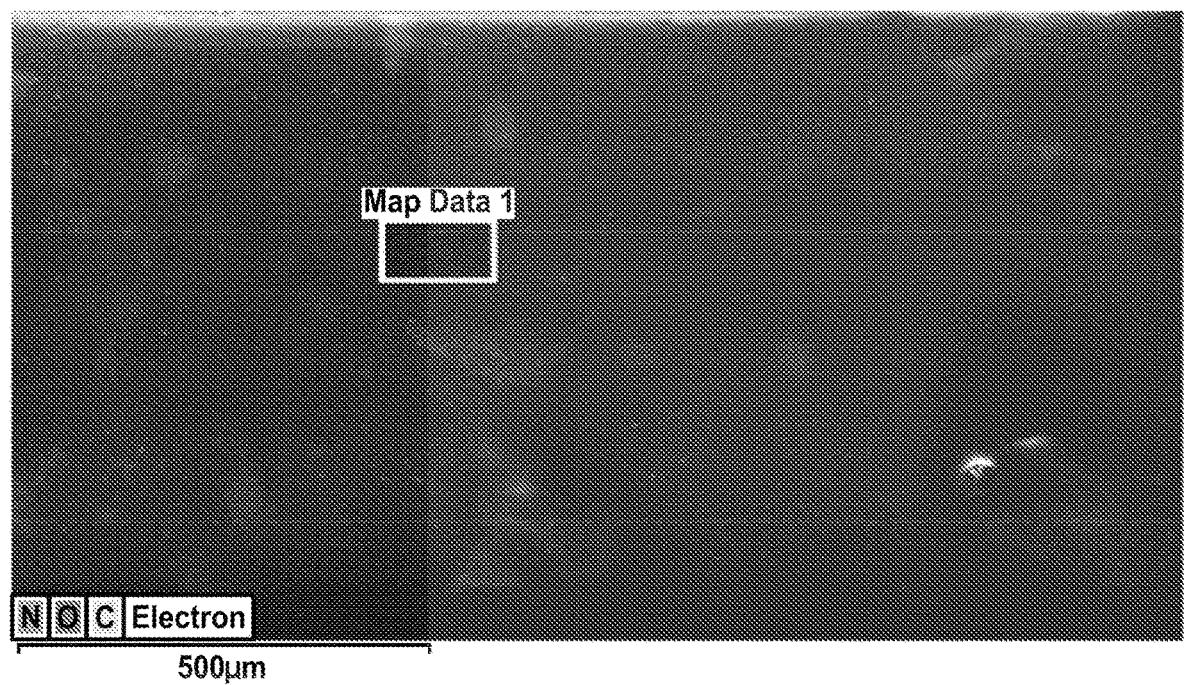
FIGS. 5A-E depict energy dispersive spectroscopy (EDS) spectra of uncoated Kapton® tape.
Figure 5B:
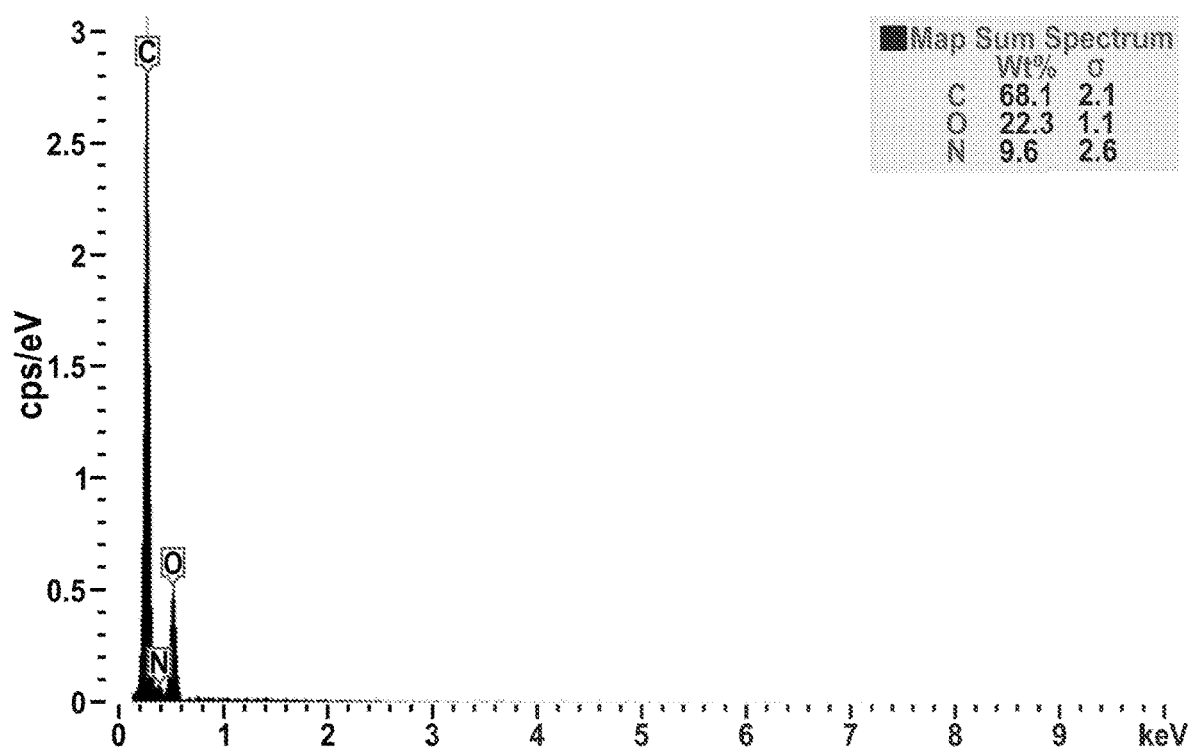
Figure 5C:
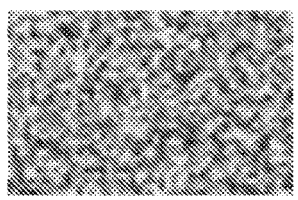
Figure 5D:
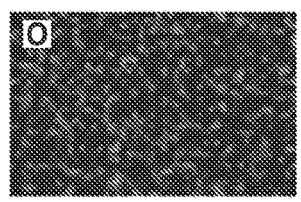
Figure 5E:
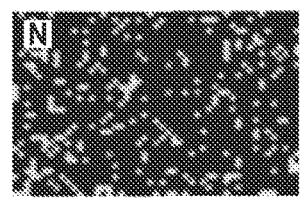
Figure 6A:
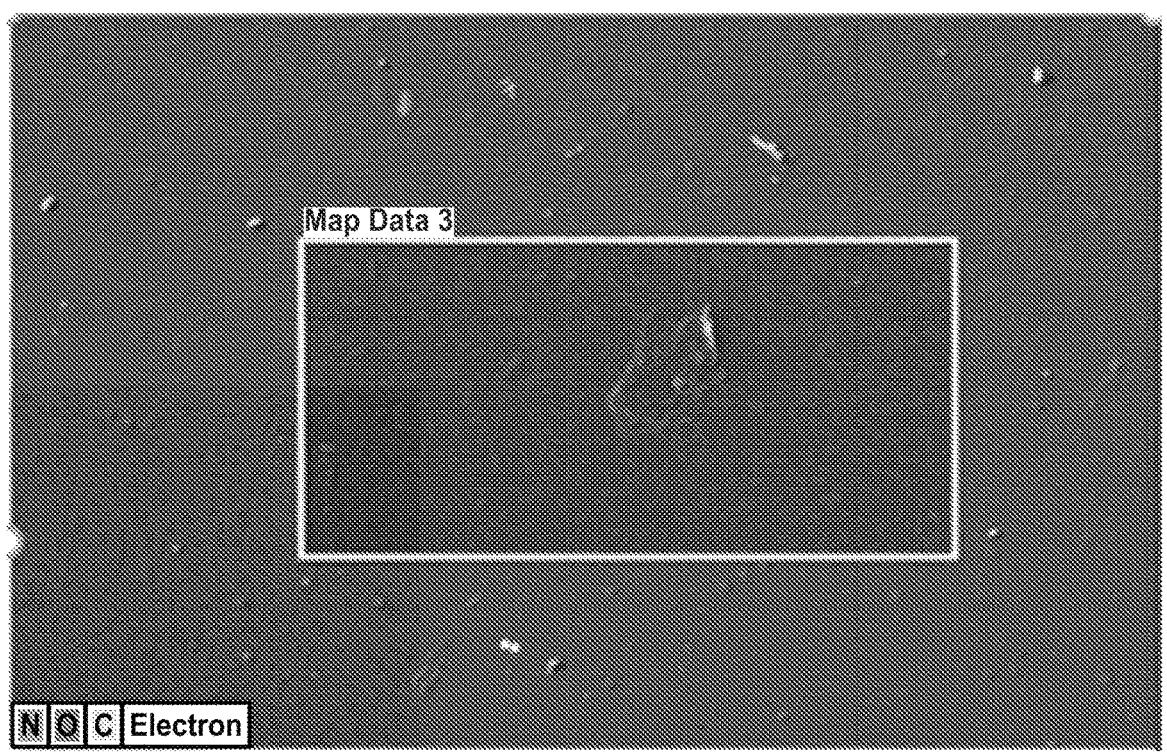
FIGS. 6A-E depict EDS spectra of graphene coated Kapton® tape.
Figure 6B:
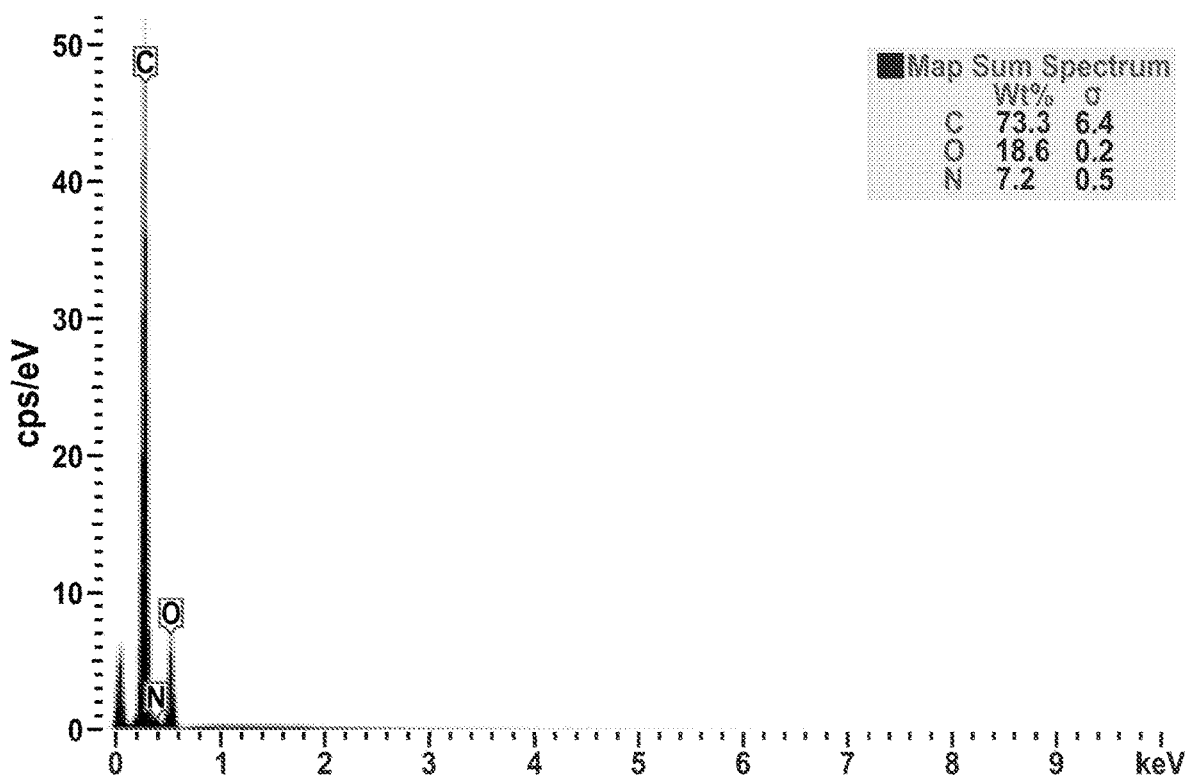
Figure 6C:
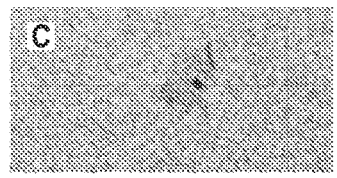
Figure 6D:
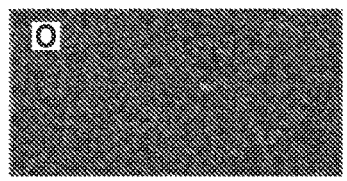
Figure 6E:
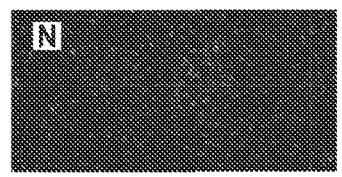

The graphene coated Kapton Tape®, Schott D 263® M Cover Glass (18, 22, 25, 50 mm), or uncoated gold (Au), copper (Cu), or nickel (Ni) slotted grids were characterized by using an X-ray photoelectron spectroscopy (PHI 5000 VersaProbe II, Physical Electronics Inc.) at an ultrahigh vacuum ($1\times10^9$ bar) instrument with a monochromatic, micro-focused, scanning x-ray source. The charge compensation was achieved with a combination of electron and argon ion flood guns. The 100 µm X-ray beam size was used to collect survey spectra (FIGS. 4A-B) with pass energy (PE) of 117 eV step size 1 eV and dwell time 20 ms. The high-energy resolution spectra (FIGS. 4C-D) were recorded with PE of 47 eV, step size 0.1 eV, and dwell time 20 ms. Auto-z (i.e., automated height adjustment to the highest intensity) was performed before each measurement to find the analyzer's focal point. The number of average sweeps of each of the elements was adjusted to (5-30 sweeps) to obtain the optimal signal-to-noise ratio. The data collected from XPS acquisition was analyzed using a Multipak software tool. The analyzed curve fit data obtained from C1s spectra of graphene coated Kapton® tape, Schott D 263® M Cover Glass (18, 22, 25, 50 mm), or gold (Au), copper (Cu), or nickel (Ni) slotted grids showed that the graphene coated Kapton® tape, Schott D 263® M Cover Glass (18, 22, 25, 50 mm), or coated gold (Au), copper (Cu), or nickel (Ni) slotted grids contains sp2-hybridized carbon bonded to different oxygen functional group C—O, C=O and C—OH (FIG. 4D).

Example 4

Both uncoated and graphene coated Kapton® films were analyzed with SE-EDX measurements. The uncoated and graphene coated Kapton® films were mounted on aluminum stub on sticky copper film. A Versa 3-D dual-beam Field Emission Scanning Electron Microscope/Focused Ion Beam (FEI, Hillsboro, Oreg., USA) with a silicon drift EDX detector (Oxford Instruments, X-MaxN, UK) were used to measure the surface morphology, elemental composition, and distribution of all elements. All the FE-SEM data reported were obtained at an acceleration voltage of 10 kV and 5 kV, spot size 4.5 and the images were collected with an ICE (Secondary Ion/Electron) detector. The elemental mapping and energy spectrums were acquired with AZTEC tools (Oxford Instruments, UK). A high electron charge was observed in Kapton® film; however, there was not much evidence of electron charge effect in graphene coated Kapton® film. The elemental maps of the element indicate a homogeneous distribution of the carbon, nitrogen, and oxygen elements. The results for uncoated Kapton® film and graphene coated Kapton® film are shown in FIGS. 5A-E and 6A-E, respectively.

Example 5

The tissue sample was formed from live cells. To form the sample, the live cells were rinsed with HEPES 25 mM for 5 minutes at room temperature (RT). Then, the cells were fixed with Kamovsky fixative (2.5% glutaraldehyde and 2% paraformaldehyde) diluted in HEPES 25 mM for 1 hour at RT. Cells were then rinsed with cacodylate buffer 0.15M (pH 7.4) for 3 minutes then post-fixed with 2% Osmium tetroxide diluted in cacodylate buffer 0.15M for 1 hour at RT inside the fume hood. Osmium tetroxide was filtered with a 0.2 µm syringe filter before adding to the samples. The cells then were rinsed with 50% ethanol diluted in deionized water 5 times until the solution was clear. Upon obtaining the clear solution, the cells were immersed in 4% uranyl acetate, and 0.4% lead citrate diluted in 70% ethanol for 5 minutes at RT inside the fume hood. After that, the cells were rinsed with 95% ethanol diluted in deionized water for 5 minutes at RT and then rinsed with 100% ethanol twice, 5 minutes each, at RT.

The cells were then placed in a 1:1 mixture of 100% ethanol and 100% acetone for 5 minutes at RT. To slowly infiltrate the resin, a 1:1 mixture of 100% acetone and resin (Embed® 812 [20 ml], DDSA [9 ml] NMA [12 ml] mixture) was added to the cells for 15 minutes at RT. After 15 min, the acetone and resin mixture was changed to a 1:3 of 100% acetone and resin for additional 15 minutes at RT. After that, a 100% resin was added to the cells for 2 hours at RT. The resin was removed and replaced with 100% resin overnight at RT inside a fume hood. The fresh resin was mixed with the accelerator DMP-30 (from Embed®812 resin kit) and added to the cells for embedding. Resin blocks were placed inside the oven at 65° C. for 48 hours.

Example 6

The formed resin black-face was then trimmed to a 0.1.0 mm trapezoid. The block side facing the knife (bottom side) was coated with a thin layer of Tackiwax (Ted Pella, Inc). 70 nm silver colored sections were cut using an ultramicrotome equipped with a modified diamond knife angled at 35° (Diatome, Biel, Switzerland, boat custom-built). A ribbon of 10-20 sections was placed on 1) graphene-coated Kapton® tape, Schott D 263® M Cover Glass (18, 22, 25, 50 mm), or uncoated gold (Au), copper (Cu), or nickel (Ni) slotted grids and 2) graphene coated coverslip. Compression due to sectioning was neutralized by exposing the sections to chloroform vapor. Bright-field and dark-field STEM images were taken using a Hitachi SU8230 and/or Hitachi SU9000. Images were obtained using the in-lens detector at 9.6 mm working distance, 80 µm aperture, and at acceleration voltages of 20, 20.5, and 30 keV. The acquisition of a full frame image took ~64 seconds for a 1280×960 image size and 24.80469 pixel size. The exemplary images obtained using the disclosed substrate are shown in FIGS. 7-13.

Example 7

Figure 7A:
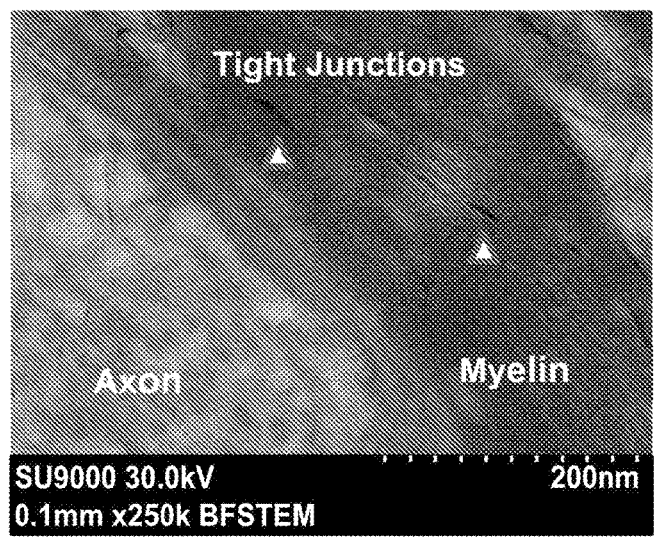
FIGS. 7A-B depict STEM spectra of twenty-nanometers (20 nm) cross-sections through myelinated axons exposed to lanthanum and imaged using bright-field (FIG. 7A) and dark-field STEM (FIG. 7B). Lanthanum is present in tight junctions (arrowheads) located within the outer myelin lamellae of thick myelin sheaths, indicating a possible natural affinity.
Figure 7B:
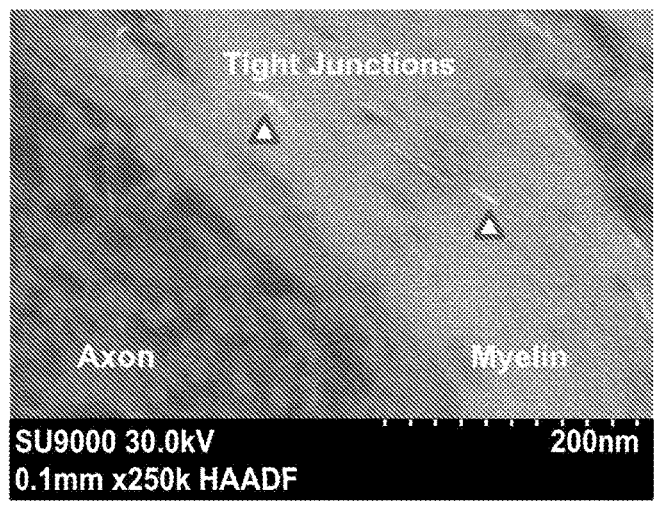

The uncoated Kapton® tape and graphene coated Kapton® tape, Schott D 263® M Cover Glass (18, 22, 25, 50 mm), or uncoated gold (Au), copper (Cu), or nickel (Ni) slotted grids were mounted on aluminum stub on sticky copper film. A Hitachi SU8230 Ultra-High-Resolution Cold field emission (CFE) Scanning Electron Microscope with a silicon drift EDX detector (Oxford Instruments, X-MaxN, UK) or a parallel EELS Spectrometer (Gatan ENFINA system) was used to measure the surface morphology, elemental composition, and distribution of all elements. Exemplary images are shown in FIGS. 7-9. All the Hitachi SU8230 data reported were obtained at an acceleration voltage of 10 kV and 5 kV, spot size 4.5 and the images were collected with an ICE (Secondary Ion/Electron) detector. The elemental mapping and energy spectrums were acquired with AZTEC tools (Oxford Instruments, UK). A high electron charge was observed in uncoated Kapton® tape, Schott D 263® M Cover Glass (18, 22, 25, 50 mm), or uncoated gold (Au), copper (Cu), or nickel (Ni) slotted grids; however, there was not much evidence of electron charge effect in graphene coated Kapton® tape, Schott D 263® M Cover Glass (18, 22, 25, 50 mm), or gold (Au), copper (Cu), or nickel (Ni) slotted grids (see FIGS. 7A-B, 8A-B, 9A, 11A-B, 12A-F, and 13). The elemental maps of the element indicate a homogeneous distribution of the carbon, nitrogen, and oxygen elements.

The devices, systems, and methods of the appended claims are not limited in scope by the specific devices, systems, and methods described herein, which are intended as illustrations of a few aspects of the claims. Any devices, systems, and methods that are functionally equivalent are intended to fall within the scope of the claims. Various modifications of the devices, systems, and methods in addition to those shown and described herein are intended to fall within the scope of the appended claims. Further, while only certain representative devices, systems, and method steps disclosed herein are specifically described, other combinations of the devices, systems, and method steps also are intended to fall within the scope of the appended claims, even if not specifically recited. Thus, a combination of steps, elements, components, or constituents may be explicitly mentioned herein or less; however, other combinations of steps, elements, components, and constituents are included, even though not explicitly stated.

Although several embodiments of the invention have been disclosed in the foregoing specification, it is understood by those skilled in the art that many modifications and other embodiments of the invention will come to mind to which the invention pertains, having the benefit of the teaching presented in the foregoing description and associated drawings. It is thus understood that the invention is not limited to the specific embodiments disclosed hereinabove and that many modifications and other embodiments are intended to be included within the scope of the appended claims. Moreover, although specific terms are employed herein, as well as in the claims which follow, they are used only in a generic and descriptive sense and not for the purposes of limiting the described invention nor the claims which follow.

Unless defined otherwise, all technical and scientific terms used herein have the same meanings as commonly understood by one of skill in the art to which the disclosed invention belongs. Publications cited herein and the materials for which they are cited are specifically incorporated by reference.

What is claimed is:

1. An article comprising:
    a) a substrate comprising a polymer film, a glass or a metal and having a first surface and an opposed second surface, wherein the polymer film has a thickness of from about 2 microns to about 300 microns; and
    b) a graphene coating disposed on the first surface of the substrate, and
   wherein the article is configured to support a sample for electron or optical microscopy.

2. The article of claim 1, wherein the substrate comprises the polymer film, and wherein the polymer film comprises a polyimide.

3. The article of claim 2, wherein the polyimide film comprises a poly(4,4'-oxydiphenylene-pyromellitimide).

4. The article of claim 1, wherein the substrate comprises the glass, and wherein the glass substrate has a thickness from about 10 to about 60 mm.

5. The article of claim 1, wherein the substrate comprises the metal, and wherein the metal substrate has a thickness from about 10 microns to about 50 microns and comprises gold, copper, or nickel grids.

6. The article of claim 1, wherein the graphene coating has a thickness from about 1 nm to about 1 micron.

7. The article of claim 1, wherein the graphene comprises a reduced graphene oxide.

8. The article of claim 7, wherein the article exhibits a sheet resistance from about 25 Ohms/square to about 100 Ohms/square.

9. The article of claim 7, wherein the reduced graphene oxide comprises from about 1% to about 30% of oxygen as measured by energy dispersive spectroscopy (EDS).

10. The article of claim 7, wherein the reduced graphene oxide comprises a carbonyl group, a carboxyl group, an epoxy group, or a combination thereof.

11. The article of claim 10, wherein the graphene coating is a substantially uniform film, and/or is substantially free of defects, and/or substantially mechanically flexible and/or substantially bendable.

12. The article of claim 1, wherein the graphene coating substantially eliminates charging artifacts resulting from an electron beam in electron microscopy and/or wherein the graphene coating is effectively invisible in a resolution range for optical microscopy.

13. A method of making an article, comprising:
    a) providing a substrate comprising a polymer film, a glass, or a metal and having a first surface and an opposed second surface, wherein the polymer film has a thickness of from about 2 microns to about 300 microns; and
    b) coating at least one layer comprising graphene on the first surface of the substrate;
   wherein the article is configured to support a sample for electron microscopy.

14. The method of claim 13, wherein the step of coating the at least one layer comprising graphene comprises a drop casting a composition comprising a reduced graphene oxide on the first surface of the substrate.

15. The method of claim 14, wherein the composition comprising the reduced graphene oxide further comprises a solvent.

16. The method of claim 14, wherein the composition further comprises a rheology modifier comprising ethyl cellulose.

17. The method of claim 13, wherein prior to the step of forming the graphene coating, the substrate is substantially free of moisture.

18. The method of claim 13, wherein the article is heated after the step of coating the at least one layer comprising graphene.

19. The method of claim 13, wherein the step of coating the at least one layer comprising graphene is repeated at least twice to form a total number of three conductive carbon layers comprising graphene.

20. The method of claim 13, further comprising annealing the article at a temperature about 250-300° C. for a time period from about 0.5 hours to about 4 hours.

21. A method comprising:
   a) mounting a ribbon of a specimen on the graphene coating of the article of claim 1; and
   b) imaging the sample with an electron microscope.

22. The method of claim 21, wherein prior to the mounting the specimen is formed by slicing a tissue sample.

23. The method of claim 22, wherein the tissue sample comprises a resin impregnated with cells, wherein the resin has a substantially cylindrical form.

24. The method of claim 22, wherein the slicing is performed in a slicing direction using a microtome knife to provide the at least one specimen section having a predetermined section thickness, wherein the section thickness is controlled by an advancement of the microtome knife into the tissue sample in a substantially perpendicular direction relative to the slicing direction.

25. The method of claim 24, further comprising a feedback loop controlling the advancement of the microtome knife to provide the predetermined section thickness.

26. The method of claim 24, wherein the ribbon of the specimen comprises from about 10 to about 20 specimen sections.

* * * * *